United States Patent
Min et al.

(10) Patent No.: US 10,617,033 B2
(45) Date of Patent: Apr. 7, 2020

(54) HEAT-RADIATING STRUCTURE AND ELECTRONIC DEVICE INCLUDING THE SAME

(71) Applicant: Samsung Electronics Co., Ltd., Suwon-si, Gyeonggi-do (KR)

(72) Inventors: Seong-Jae Min, Suwon-si (KR); Ji-Hun Seo, Suwon-si (KR); Sea-Young Lee, Suwon-si (KR); Jong-Min Lee, Seongnam-si (KR); Hyo-Seok Na, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 15/846,952

(22) Filed: Dec. 19, 2017

(65) Prior Publication Data

US 2018/0199462 A1    Jul. 12, 2018

(30) Foreign Application Priority Data

Jan. 6, 2017 (KR) .......................... 10-2017-0002293

(51) Int. Cl.
*H05K 5/00* (2006.01)
*H05K 7/20* (2006.01)
(Continued)

(52) U.S. Cl.
CPC ......... *H05K 7/2039* (2013.01); *G06F 1/1635* (2013.01); *G06F 1/203* (2013.01);
(Continued)

(58) Field of Classification Search
CPC ...................................... H05K 5/00
See application file for complete search history.

(56) References Cited

U.S. PATENT DOCUMENTS 9,063,707 B2    6/2015  De Cesare et al.
2002/0186530 A1*  12/2002  Nakajima ............ B60G 17/052
                                                    361/679.09
(Continued)

FOREIGN PATENT DOCUMENTS

CN   101933410 A   12/2010
CN   203261623 U   10/2013
(Continued)

OTHER PUBLICATIONS

Extended European Search Report dated Nov. 12, 2019, issued in European Application No. 17890010.6.
(Continued)

*Primary Examiner* — Jerry Wu
(74) *Attorney, Agent, or Firm* — Jefferson IP Law, LLP

(57) ABSTRACT

A portable communication device is provided. The portable communication device includes a battery, a printed circuit board including one or more circuit devices driven using power from the battery, and a bracket including a first area for receiving the battery and a second area for receiving the printed circuit board, wherein a slit is formed in at least a portion of a boundary area of the first area and the second area to reduce heat spread. According to an embodiment of the present disclosure, in an electronic device, a heat-radiating structure is provided between a PCB and a bracket where a battery is seated, rerouting the path along which heat radiation from some circuit devices on the PCB flow to the battery to suppress a rise in temperature in the battery.

18 Claims, 16 Drawing Sheets

(51) Int. Cl.
*H05K 7/14* (2006.01)
*H04M 1/02* (2006.01)
*G06F 1/20* (2006.01)
*G06F 1/16* (2006.01)

(52) U.S. Cl.
CPC ........ *H04M 1/0202* (2013.01); *H05K 5/0086* (2013.01); *H05K 7/1417* (2013.01); *H04M 1/0262* (2013.01)

(56) References Cited

U.S. PATENT DOCUMENTS

| | | | |
|---|---|---|---|
| 2010/0072952 A1* | 3/2010 | Nakajima | H04B 1/036 320/150 |
| 2010/0290183 A1 | 11/2010 | Rijken et al. | |
| 2014/0078679 A1 | 3/2014 | Tsunoda et al. | |
| 2014/0160684 A1 | 6/2014 | Wittenberg et al. | |
| 2015/0062823 A1 | 3/2015 | Seo et al. | |
| 2015/0220122 A1 | 8/2015 | Rhee et al. | |
| 2016/0313773 A1 | 10/2016 | Kim et al. | |
| 2017/0139452 A1 | 5/2017 | Yang et al. | |

FOREIGN PATENT DOCUMENTS

| | | |
|---|---|---|
| CN | 105611984 A | 5/2016 |
| CN | 105828572 A | 8/2016 |
| EP | 0 727 928 A1 | 8/1996 |
| EP | 0 727 928 B1 | 9/1996 |
| JP | 2006-310740 A | 11/2006 |
| JP | 2007-122132 A | 5/2007 |
| KR | 10-2014-0000933 A | 1/2014 |
| WO | 2009/096966 A1 | 8/2009 |

OTHER PUBLICATIONS

Chinese Office Action dated Jan. 16, 2020, issued in Chinese Application No. 201780081970.0.

* cited by examiner

HEAT-RADIATING STRUCTURE AND ELECTRONIC DEVICE INCLUDING THE SAME

CROSS-REFERENCE TO RELATED APPLICATION(S)

This application claims the benefit under 35 U.S.C. § 119(a) of a Korean patent application filed on Jan. 6, 2017 in the Korean Intellectual Property Office and assigned Serial number 10-2017-0002293, the entire disclosure of which is hereby incorporated by reference.

TECHNICAL FIELD

The present disclosure relates to electronic devices with a heat-radiating structure. More particularly, the present disclosure relates to a structure for reducing differences in temperature per position in a battery embedded in an electronic device.

BACKGROUND

Portable terminals or other electronic equipped with brand-new capabilities are quickly spreading and becoming an inherent part of human life.

The advance in mobile technology is leading to increasing demand for more compact and lightweight portable terminals, e.g., smartphones, with maximized user portability and convenience along with the need for integrating the parts in a smaller space for higher performance.

According to the related art, an electronic device has a printed circuit board (PCB) and a battery seated in a bracket. Since heat radiation from some circuit parts on the PCB are directly delivered through the bracket to the battery, significant differences in temperature occur per position in the battery, threatening the safety of the battery.

The above information is presented as background information only to assist with an understanding of the present disclosure. No determination has been made, and no assertion is made, as to whether any of the above might be applicable as prior art with regard to the present disclosure.

SUMMARY

Aspects of the present disclosure are to address at least the above-mentioned problems and/or disadvantages and to provide at least the advantages described below. Accordingly, an aspect of the present disclosure is to provide a heat-radiating structure for reducing differences in temperature per position in a battery embedded in an electronic device.

Another aspect of the present disclosure, in an electronic device, a heat-radiating structure is provided between the printed circuit board (PCB) and the bracket seated on the PCB to form a heat transfer path along which heat generated from some circuit devices on the PCB is prevented from reaching the battery, thereby restricting a rise in temperature of the battery.

Another aspect of the present disclosure is to provide an electronic device, a heat conducting member is disposed in at least a portion of a bracket where a PCB is seated, leading heat spread in various directions.

In accordance with an aspect of the present disclosure, a portable communication device is provided. The portable communication device includes a battery, a printed circuit board comprising one or more circuit devices driven using power from the battery, and a bracket comprising a first area for receiving the battery and a second area for receiving the printed circuit board, wherein a slit is formed in at least a portion of a boundary area of the first area and the second area to reduce heat spread.

In accordance another aspect of the present disclosure, a portable communication device is provided. The portable communication device includes a battery, a printed circuit board comprising at least one circuit device driven using power from the battery, and a bracket comprising a first area for receiving the battery and a second area for receiving the printed circuit board, wherein the bracket comprises a heat-radiating structure formed between the first area and the second area or in at least one of the first area and the second area to reduce conduction of heat generated from some circuit devices of the at least one circuit device to the battery.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which.

Throughout the drawings, like reference numerals will be understood to refer to like parts, components, and structures.

DETAILED DESCRIPTION

Figure 1:
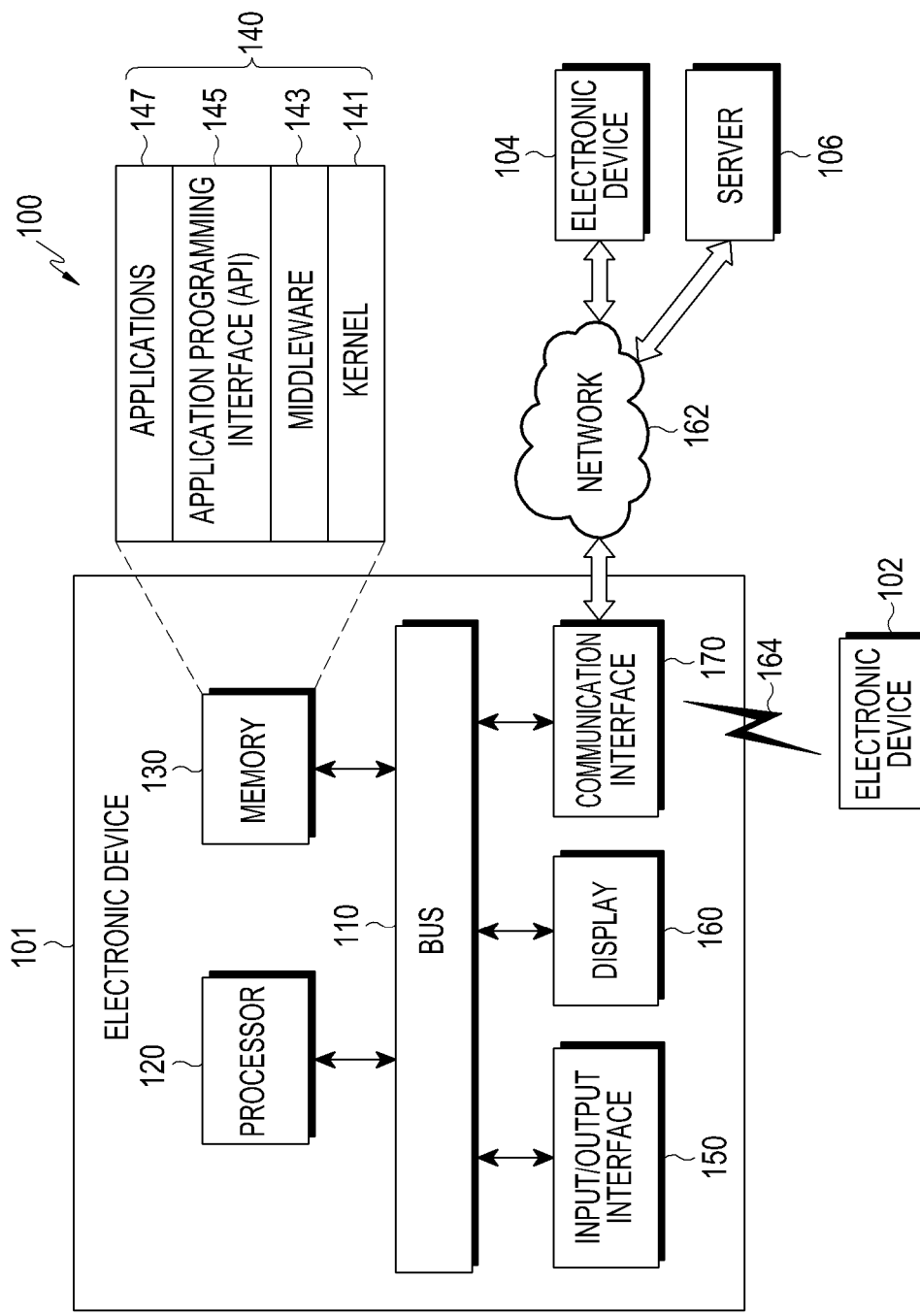
FIG. 1 is a view illustrating an electronic device in a network environment according to an embodiment of the present disclosure.

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

The same or similar reference denotations may be used to refer to the same or similar elements throughout the specification and the drawings. It is to be understood that the singular forms "a," "an," and "the" include plural references unless the context clearly dictates otherwise. As used herein, the terms "A or B" or "at least one of A and/or B" may include all possible combinations of A and B. As used herein, the terms "first" and "second" may modify various components regardless of importance and/or order and are used to distinguish a component from another without limiting the components. It will be understood that when an element (e.g., a first element) is referred to as being (operatively or communicatively) "coupled with/to," or "connected with/to" another element (e.g., a second element), it can be coupled or connected with/to the other element directly or via a third element.

As used herein, the terms "configured to" may be interchangeably used with other terms, such as "suitable for," "capable of," "modified to," "made to," "adapted to," "able to," or "designed to" in hardware or software in the context. Rather, the term "configured to" may mean that a device can perform an operation together with another device or parts. For example, the term "processor configured (or set) to perform A, B, and C" may mean a generic-purpose processor (e.g., a central processing unit (CPU) or application processor) that may perform the operations by executing one or more software programs stored in a memory device or a dedicated processor (e.g., an embedded processor) for performing the operations.

For example, examples of the electronic device according to embodiments of the present disclosure may include at least one of a smartphone, a tablet personal computer (PC), a mobile phone, a video phone, an e-book reader, a desktop PC, a laptop computer, a netbook computer, a workstation, a server, a personal digital assistant (PDA), a portable multimedia player (PMP), a Moving Picture Experts Group phase 1 or phase 2 (MPEG-1 or MPEG-2) audio layer 3 (MP3) player, a medical device, a camera, or a wearable device. The wearable device may include at least one of an accessory-type device (e.g., a watch, a ring, a bracelet, an anklet, a necklace, glasses, contact lenses, or a head-mounted device (HMD)), a fabric-integrated device or clothes-integrated device (e.g., electronic clothes), a body attaching-type device (e.g., a skin pad or tattoo), or a body implantable device. In some embodiments, examples of the smart home appliance may include at least one of a television, a digital versatile disc (DVD) player, an audio player, a refrigerator, an air conditioner, a cleaner, an oven, a microwave oven, a washer, a drier, an air cleaner, a set-top box, a home automation control panel, a security control panel, a television (TV) box (e.g., Samsung HomeSync™, Apple TV™, or Google TV™), a gaming console (Xbox™, PlayStation™), an electronic dictionary, an electronic key, a camcorder, or an electronic picture frame.

According to an embodiment of the present disclosure, the electronic device may include at least one of various medical devices (e.g., diverse portable medical measuring devices (a blood sugar measuring device, a heartbeat measuring device, or a body temperature measuring device), a magnetic resource angiography (MRA) device, a magnetic resource imaging (MRI) device, a computed tomography (CT) device, an imaging device, or an ultrasonic device), a navigation device, a global navigation satellite system (GNSS) receiver, an event data recorder (EDR), a flight data recorder (FDR), an automotive infotainment device, a sailing electronic device (e.g., a sailing navigation device or a gyro compass), avionics, security devices, vehicular head units, industrial or home robots, drones, automatic teller's machines (ATMs), point of sales (POS) devices, or internet of things (IoT) devices (e.g., a bulb, various sensors, a sprinkler, a fire alarm, a thermostat, a street light, a toaster, fitness equipment, a hot water tank, a heater, or a boiler). According to various embodiments of the disclosure, examples of the electronic device may at least one of part of a piece of furniture, building/structure or vehicle, an electronic board, an electronic signature receiving device, a projector, or various measurement devices (e.g., devices for measuring water, electricity, gas, or electromagnetic waves). According to embodiments of the present disclosure, the electronic device may be flexible or may be a combination of the above-enumerated electronic devices. According to an embodiment of the disclosure, the electronic devices are not limited to those described above. As used herein, the term "user" may denote a human or another device (e.g., an artificial intelligent electronic device) using the electronic device.

FIG. 1 is a view illustrating an electronic device in a network environment according to an embodiment of the present disclosure.

Referring to FIG. 1, according to an embodiment of the present disclosure, an electronic device 101 is included in a network environment 100. The electronic device 101 may include a bus 110, a processor 120, a memory 130, an input/output interface 150, a display 160, and a communication interface 170. In some embodiments, the electronic device 101 may exclude at least one of the components or may add another component. The bus 110 may include a circuit for connecting the components 110, 120, 130, 150, 160 and 170 with one another and transferring communications (e.g., control messages or data) between the components. The processor 120 may include one or more of a central processing unit (CPU), an application processor (AP), or a communication processor (CP). The processor 120 may perform control on at least one of the other components of the electronic device 101, and/or perform an operation or data processing relating to communication.

The memory 130 may include a volatile and/or non-volatile memory. For example, the memory 130 may store commands or data related to at least one other component of the electronic device 101. According to an embodiment of the present disclosure, the memory 130 may store software and/or a program 140. The program 140 may include, e.g., a kernel 141, middleware 143, an application programming interface (API) 145, and/or an application program (or "application") 147. At least a portion of the kernel 141, middleware 143, or API 145 may denote an operating system (OS). For example, the kernel 141 may control or manage system resources (e.g., the bus 110, the processor 120, or the memory 130) used to perform operations or functions implemented in other programs (e.g., the middleware 143, the API 145, or the application program 147). The kernel 141 may provide an interface that allows the middleware 143, the API 145, or the application 147 to access the individual components of the electronic device 101 to control or manage the system resources.

The middleware 143 may function as a relay to allow the API 145 or the application 147 to communicate data with the kernel 141, for example. Further, the middleware 143 may process one or more task requests received from the application program 147 in order of priority. For example, the middleware 143 may assign a priority of using system resources (e.g., the bus 110, the processor 120, or the memory 130) of the electronic device 101 to at least one of the application programs 147 and process one or more task requests. The API 145 is an interface allowing the application 147 to control functions provided from the kernel 141 or the middleware 143. For example, the API 133 may include at least one interface or function (e.g., a command) for filing control, window control, image processing or text control. For example, the input/output interface 150 may transfer commands or data input from the user or other external device to other component(s) of the electronic device 101 or may output commands or data received from other component(s) of the electronic device 101 to the user or other external devices.

The display 160 may include, e.g., a liquid crystal display (LCD), a light emitting diode (LED) display, an organic light emitting diode (OLED) display, or a microelectromechanical systems (MEMS) display, or an electronic paper display. The display 160 may display, e.g., various contents (e.g., text, images, videos, icons, or symbols) to the user. The display 160 may include a touchscreen and may receive, e.g., a touch, gesture, proximity or hovering input using an electronic pen or a body portion of the user. For example, the communication interface 170 may set up communication between the electronic device 101 and an external electronic device (e.g., a first electronic device 102, a second electronic device 104, or a server 106). For example, the communication interface 170 may be connected with a network 162 through wireless or wired communication to communicate with the external electronic device.

The wireless communication may include cellular communication which uses at least one of, e.g., long term evolution (LTE), long term evolution-advanced (LTE-A), code division multiple access (CDMA), wideband code division multiple access (WCDMA), universal mobile telecommunication system (UMTS), wireless broadband (WiBro), or global system for mobile communication (GSM). According to an embodiment of the present disclosure, the wireless communication may include at least one of, e.g., Wi-Fi, light-fidelity (Li-Fi), Bluetooth (BT), bluetooth low power (BLE), zigbee, near-field communication (NFC), magnetic secure transmission (MST), radio frequency (RF), or body area network (BAN) as denoted with denotation 164 of FIG. 1. According to an embodiment of the present disclosure, the wireless communication may include global navigation satellite system (GNSS). The GNSS may be, e.g., global positioning system (GPS), global navigation satellite system (Glonass), Beidou navigation satellite system (hereinafter, "Beidou") or Galileo, or the European global satellite-based navigation system. Hereinafter, the terms "GPS" and the "GNSS" may be interchangeably used herein. The wired connection may include at least one of, e.g., universal serial bus (USB), high definition multimedia interface (HDMI), recommended standard (RS)-232, power line communication (PLC), or plain old telephone service (POTS). The network 162 may include at least one of telecommunication networks, e.g., a computer network (e.g., local area network (LAN) or wide area network (WAN)), Internet, or a telephone network.

The first and second external electronic devices 102 and 104 each may be a device of the same or a different type from the electronic device 101. According to an embodiment of the present disclosure, all or some of operations executed on the electronic device 101 may be executed on another or multiple other electronic devices (e.g., the first and second electronic devices 102 and 104 or the server 106). According to an embodiment of the present disclosure, when the electronic device 101 should perform some function or service automatically or at a request, the electronic device 101, instead of executing the function or service on its own or additionally, may request another device (e.g., first and second electronic devices 102 and 104 or the server 106) to perform at least some functions associated therewith. The other electronic device (e.g., first and second electronic devices 102 and 104 or the server 106) may execute the requested functions or additional functions and transfer a result of the execution to the electronic device 101. The electronic device 101 may provide a requested function or service by processing the received result as it is or additionally. To that end, a cloud computing, distributed computing, or client-server computing technique may be used, for example.

Figure 2A:
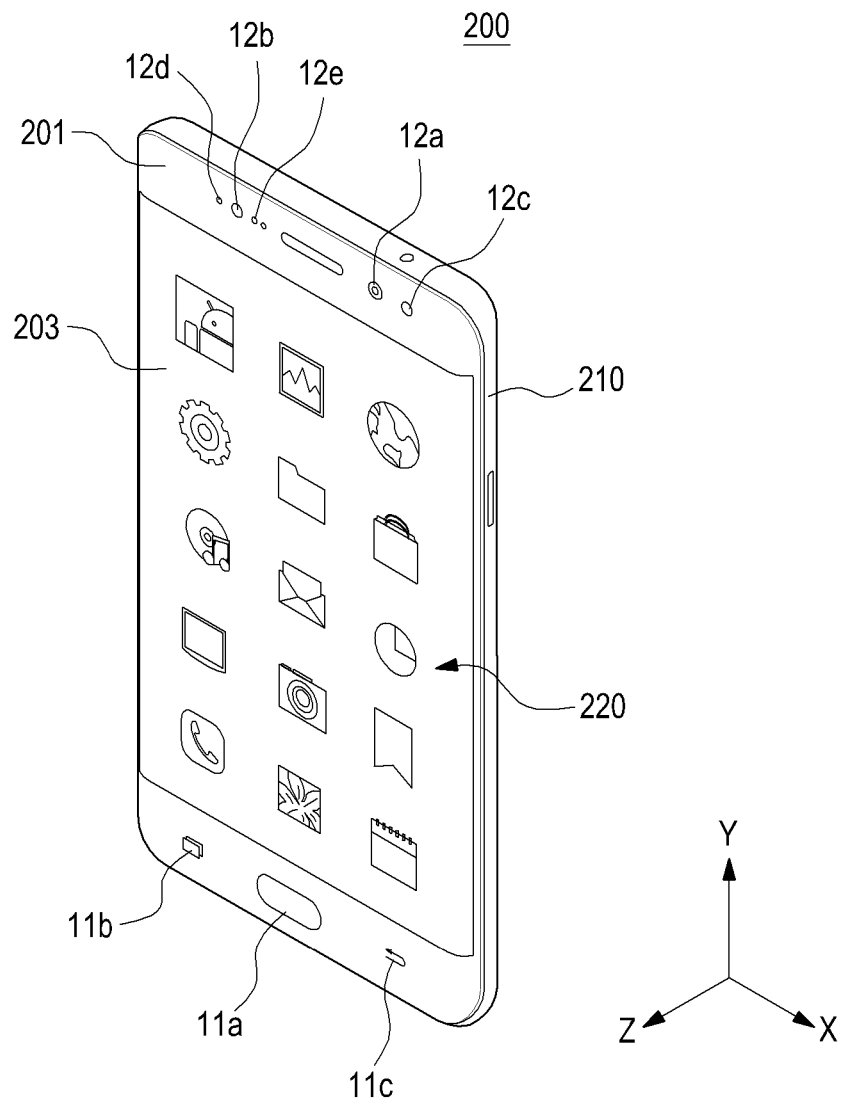
FIG. 2A is a perspective view illustrating an electronic device according to an embodiment of the present disclosure.

FIG. 2A is a perspective view illustrating an electronic device according to an embodiment of the present disclosure.

Figure 2B:
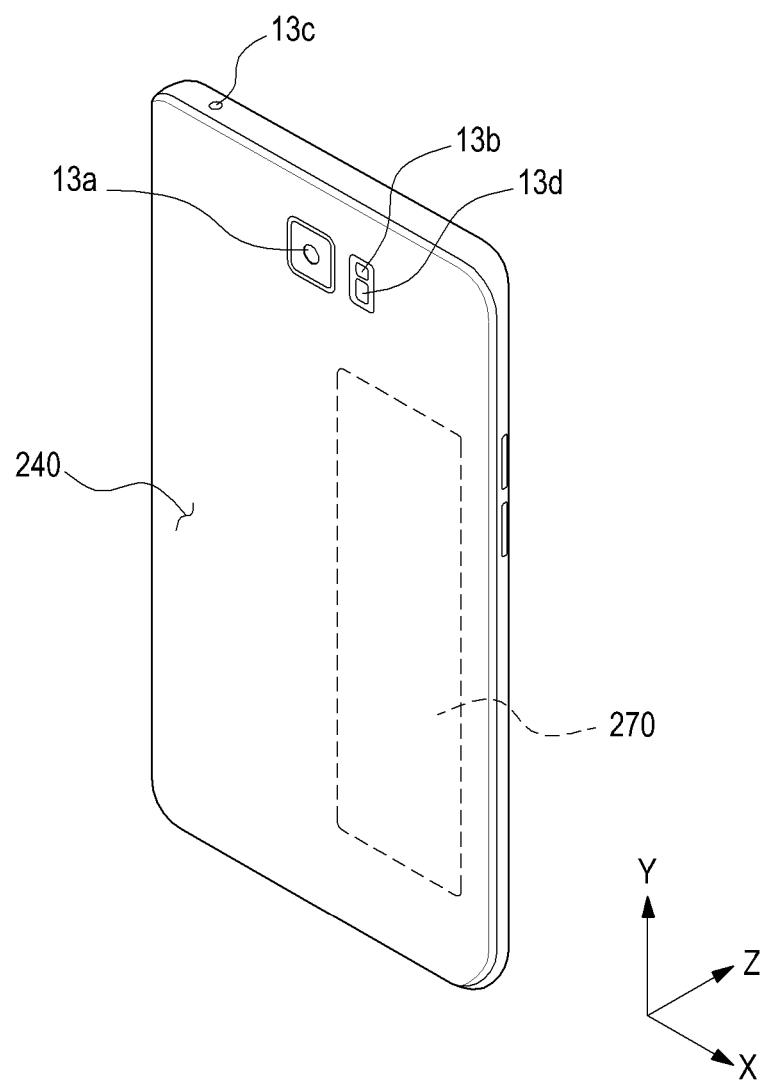
FIG. 2B is a perspective view illustrating an electronic device as viewed in a different direction according to an embodiment of the present disclosure.

FIG. 2B is a perspective view illustrating an electronic device as viewed in a different direction according to an embodiment of the present disclosure.

Figure 2C:
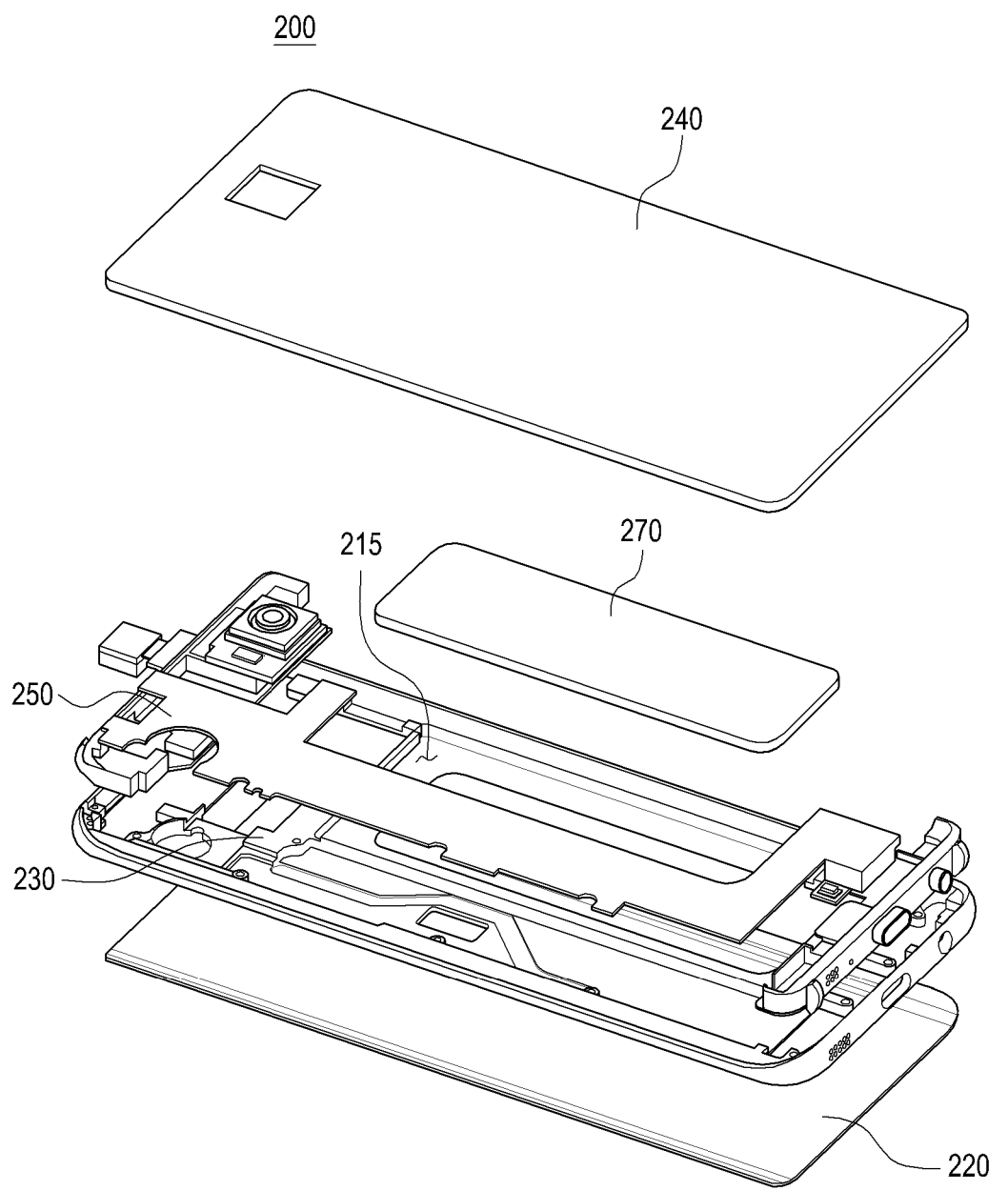
FIG. 2C is an exploded perspective view illustrating part of an electronic device according to an embodiment of the present disclosure.

FIG. 2C is an exploded perspective view illustrating part of an electronic device according to an embodiment of the present disclosure.

Referring to FIGS. 2A, 2B, and 2C, an electronic device 200 may be at least partially or wholly the same as the electronic device (e.g., the electronic device 101) of FIG. 1.

In the three-axis rectangular coordinate system as shown in FIGS. 2A to 2C, 'X,' 'Y,' and 'Z,' respectively, may denote the width, length, and height direction of the electronic device 200. As used herein, "first direction (+Z)" may refer to a direction perpendicular to a surface of a transparent cover 203, and "second direction (−Z)" may refer to an opposite direction of "first direction (+Z)."

According to an embodiment of the present disclosure, the electronic device 200 may include a housing 210 and a display device 220. The housing 210 may include a first surface 201 facing in the first direction (+Z) and a second surface may be formed as a rear cover 240 facing in a second direction (−Z) which is an opposite direction of the first direction (+Z). The first surface 201 may be the front surface of the housing 210, and the rear cover 240. The housing 210 may have a front opening. The transparent cover 203 may be provided to form at least part of the front surface 201 of the housing 210, closing the front opening of the front surface 201 of the housing 210. The electronic device 200 may have a keypad in a side area of the transparent cover 203 on the housing 210. The keypad may include buttons or touch keys 11a, 11b, and 11c that are operated mechanically. The touch keys 11a, 11b, and 11c may generate input signals as they are touched by the user's body. According to an embodiment of the present disclosure, the keypad may be implemented to include only mechanical buttons or only the touch keys. As another example, the keypad may be implemented in a mixed type of the mechanical button type and the touch type. The keypad may provide various screens on the display corresponding to a shorter or longer press or touch on the buttons.

According to an embodiment of the present disclosure, the housing 210 may be an element for receiving various electronic parts. At least part of the housing 210 may be formed of a conductive material. For example, the housing 210 may have side walls that form outer side surfaces of the electronic device 200. Portions of the housing 210, which are exposed to the outside of the electronic device 200, may be formed of a metal. A printed circuit board 250 and/or a battery 270 may be received inside the housing 210.

According to an embodiment of the present disclosure, the printed circuit board 250 may have a circuit of the terminal, e.g., at least one of an AP, a CP, a memory, and a RF transceiver, mounted thereon, and the printed circuit board 250 may include a signal line (e.g., a RF signal line). For example, a processor, a communication module, various interfaces (e.g., the interfaces 150 and 170 of FIG. 1), or a power management module may be mounted on the printed circuit board 250 in the form of an integrated circuit (IC) chip. For example, a control circuit may also be configured in an IC chip and mounted on the printed circuit board. For example, the control circuit may be part of the processor or the communication module. The housing 210 embeds the battery 270 to secure power.

According to an embodiment of the present disclosure, a first camera 12a, a light source unit 12b, or an iris camera 12c may be provided in an upper area of the front surface of the electronic device 200. For example, the light source unit 12b may be an infrared (IR) LED. The iris camera 12c may take an image of the user's eye using, as a light source, near infrared light emitted from the IR LED, thereby recognizing iris information. As another example, a light source unit indication lamp 12d, an illuminance sensor or proximity sensor 12e may be included in the upper area of the front surface of the electronic device 200. As another example, a second camera 13a, a heart rate sensor (or heart rate monitor (HRM)) 13d or a flash 13b may be provided on the rear cover 240 of the electronic device 200. A microphone 13c may be provided on an upper portion of the electronic device 200.

According to an embodiment of the present disclosure, the display device 220 may be exposed through the front surface of the housing 210. The display device 220 may be, at least partly, formed of a material that transmits radio waves or magnetic fields. The display device 220 may be mounted on the front surface of the housing 210. The display device 220 may include a display panel that is mounted under the transparent cover 203 formed of reinforced glass. A touch panel may be provided between the transparent cover 203 and the display panel. For example, the display device 220 may be utilized as an input device equipped with touchscreen functionality, not alone as an output device for outputting screen.

According to an embodiment of the present disclosure, the display device 220 may include a dielectric layer and an optical layer. The dielectric layer may be disposed in contact with the transparent cover 203. The dielectric layer may include, e.g., silicone, air, a foam, a membrane, an optical clear adhesive (OCA), sponge, rubber, ink, or a polymer (e.g., polycarbonate (PC) or PET). The optical layer may be disposed on the rear surface of the dielectric layer.

According to an embodiment of the present disclosure, the electronic device 200 may include the rear cover 240 to protect the rear surface of the housing 210. The rear cover 240 is mounted to face the display device 220, i.e., in the second direction −Z. The rear cover 240 may be formed of a material capable of transmitting radio waves or magnetic fields, e.g., reinforced glass or synthetic resin. The rear cover 240, along with the housing 210 and the display device 220, may configure an outer look of the electronic device 200.

According to an embodiment of the present disclosure, the housing 210 may have a bracket 230 internally extending. The bracket 230 may be formed of a metal. The bracket 230 may be disposed in a space formed by the display device 220 and the rear cover 240. For example, the bracket 230 may be interposed between the display device 220 and the printed circuit board 250. The bracket 230 may prevent IC chips mounted on the printed circuit board 250 from contacting the display device 220. The supporting member 480 may provide electromagnetic shielding, preventing electromagnetic interference between the IC chips. The bracket 230 may reinforce the hardness of the electronic device 200. For example, the housing 210 may have several openings or recesses formed depending on the arrangement of the electronic parts inside the electronic device 200, deteriorating the hardness of the housing 210 or the electronic device 200.

The bracket 230 may be mounted and fastened inside the housing 210, reinforcing the hardness of the housing 210 or the electronic device 200.

Although not shown in the drawings, according to an embodiment of the present disclosure, various structures may be formed on the surface of the housing 210 and the bracket 230 depending on the arrangement of electronic parts inside the electronic device 200 or the structure in which the housing 210 and the bracket 230 are fastened together. For example, spaces for receiving IC chips mounted on the printed circuit board 250 may be formed in the housing 210 and/or the bracket 230. The spaces for the IC chips may be formed in recessed shapes or ribs surrounding the IC chips. According to an embodiment of the present disclosure, the housing 210 and the bracket 230 may have their corresponding fastening bosses or holes. For example, the housing 210 and the bracket 230 may be fastened together, with the bracket 230 facing or received in the housing 210 by fitting screws or other couplers to the fastening bosses or holes. According to an embodiment of the present disclosure, power may be secured by placing the battery 270 in a mounting hole 215 that is formed in the housing 210.

According to an embodiment of the present disclosure, a configuration of a heat-radiating structure in the electronic device 200 is described below in more detail.

Figure 3A:
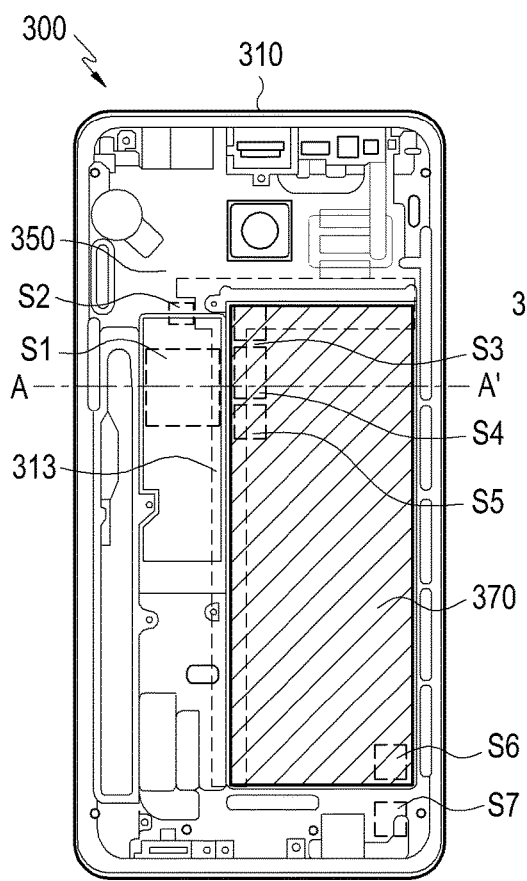
FIG. 3A is a front view illustrating an internal configuration of an electronic device with electronic parts mounted therein, according to an embodiment of the present disclosure.

FIG. 3A is a front view illustrating an internal configuration of an electronic device with a printed circuit board and a battery mounted therein, according to an embodiment of the present disclosure.

Figure 3B:
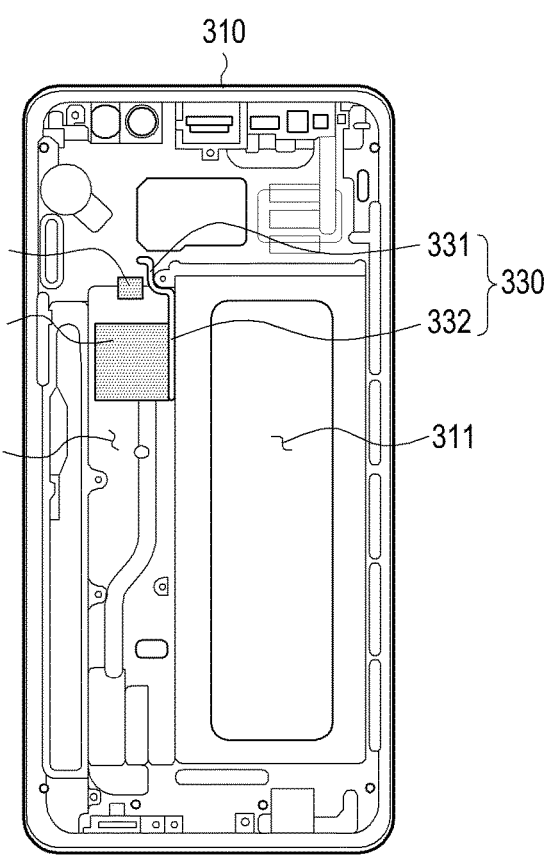
FIG. 3B is a front view schematically illustrating an electronic device bracket and an internal thermal source structure according to an embodiment of the present disclosure.

FIG. 3B is a front view schematically illustrating an electronic device bracket and an internal heat source structure with neither a printed circuit board nor a battery mounted therein, according to an embodiment of the present disclosure.

Referring to FIGS. 3A and 3B, a bracket 310 and internal components of an electronic device 300 (e.g., 101 of FIG. 1) may at least partially or wholly be the same as the bracket 230 and electronic parts of the electronic device 200 of FIGS. 2A to 2C.

The electronic device 300 may include the bracket 310, a printed circuit board 350, and a battery 370. At least one heat-radiating structure may be included in the bracket 310. Examples of the heat-radiating structure may include a slit 330, a step, a recess, or other various shapes.

According to an embodiment of the present disclosure, the bracket 310 may include a first area 311 for receiving the battery 370 and a second area 312 positioned adjacent the first area 311 to receive the printed circuit board 350. For example, upon viewing a surface of the bracket 310 that faces in the rear direction (i.e., the second direction –Z of FIGS. 2A to 2C), the first area 311 is disposed in at least a portion at the right side of the bracket 310, and the first area 311 may have a seating hole corresponding to the shape of the battery 370 to place the battery 370 therein. As another example, the second area 312 may be disposed in an area at the left and/or upper side of the bracket 310, and the second area 312 may have a seating hole to place the printed circuit board 350 therein.

According to an embodiment of the present disclosure, no limitations are imposed on the number, size, or shape of heat-radiating structures. For example, one or more heat-radiating structures may be provided without limitation in size or shape. Accordingly, the heat-radiating structure may be formed between the first area 311 and the second area 312 or in at least one of the first area 311 and the second area 312. This may reduce the conduction of heat radiated from at least one circuit device on the printed circuit board to the battery. For example, the heat-radiating structure may be formed in a predetermined space (e.g., a gap) between the first area 311 and the second area 312, or the heat-radiating structure may be formed to overlap the first area 311 and the second area 312. As another example, the heat-radiating structure may be disposed in one of the first area 311 or the second area 312, or the heat-radiating structure may be formed in an area overlapping the first area 311 or the second area 312.

According to an embodiment of the present disclosure, at least one slit 330 may be provided in at least a portion of a boundary area 313 of the first area 311 and the second area 312. The number or size of the at least one slit is not limited to a particular one. The boundary area 313 may be the first area 311 and/or the second area 312, a partial area overlapping the first area 311 and/or the second area 312, or may include an area between the first area 311 and the second area 312. For example, the slit 330 may be formed on the path along which heat generated from the second area 312 is delivered to the first area 311, changing the heat transfer path or blocking heat to the first area 311. As another example, the slit 330 may be disposed adjacent the circuit device 352 in the printed circuit board for the battery 370 or adjacent the battery 370 for the circuit device 352, reducing heat spread from one or more circuit devices 352.

For example, the metal-containing bracket 310 may raise the effect of spreading heat from some circuit devices of the printed circuit board 350 to a side area of the battery 370, thus causing excessive heat concentration onto the side area of the battery 370 and resultant rise in temperature. The rise in temperature at the side part of the battery 370 may unbalance the overall temperature difference of the battery 370, deteriorating the performance of the battery 370. Thus, according to an embodiment of the present disclosure, forming at least one opening and/or recessed slit 330 in the side area of the battery 370 may reroute the heat radiation from the side area of the electronic device 300 to the surroundings. The structure of the slit 330 is described below in detail.

Figure 4:
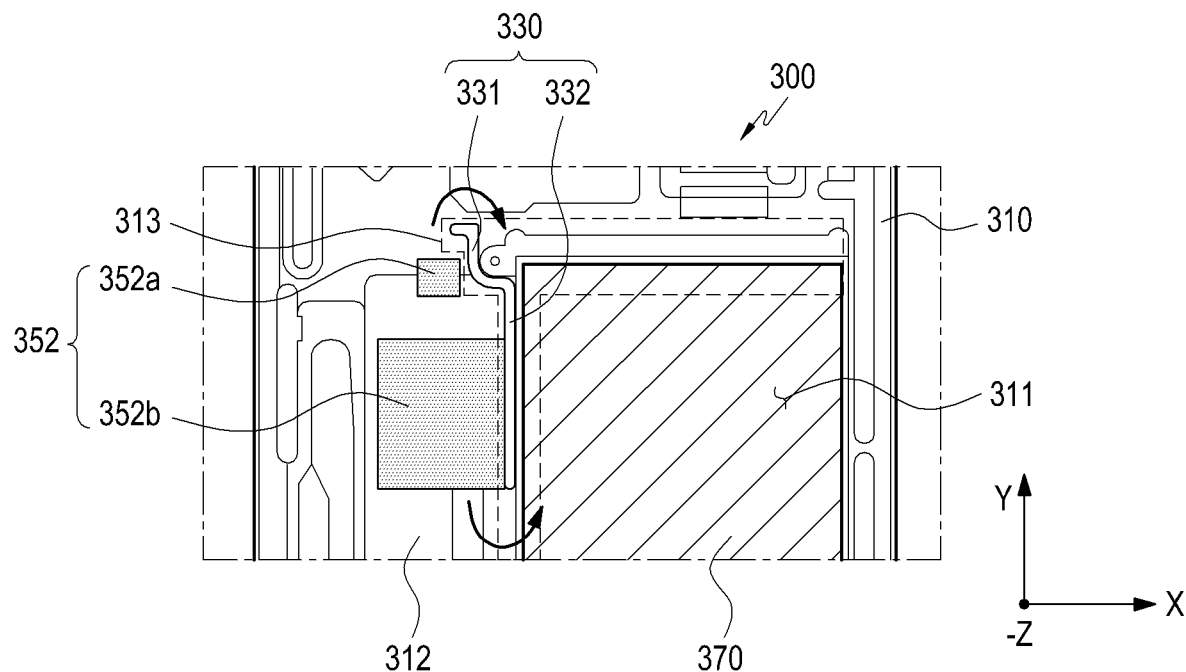
FIG. 4 is a front view schematically illustrating a heat transfer path in a slit structure formed in a bracket according to an embodiment of the present disclosure.

FIG. 4 is a front view schematically illustrating a heat transfer path in a slit structure formed in a bracket 310 according to an embodiment of the present disclosure.

Figure 5:
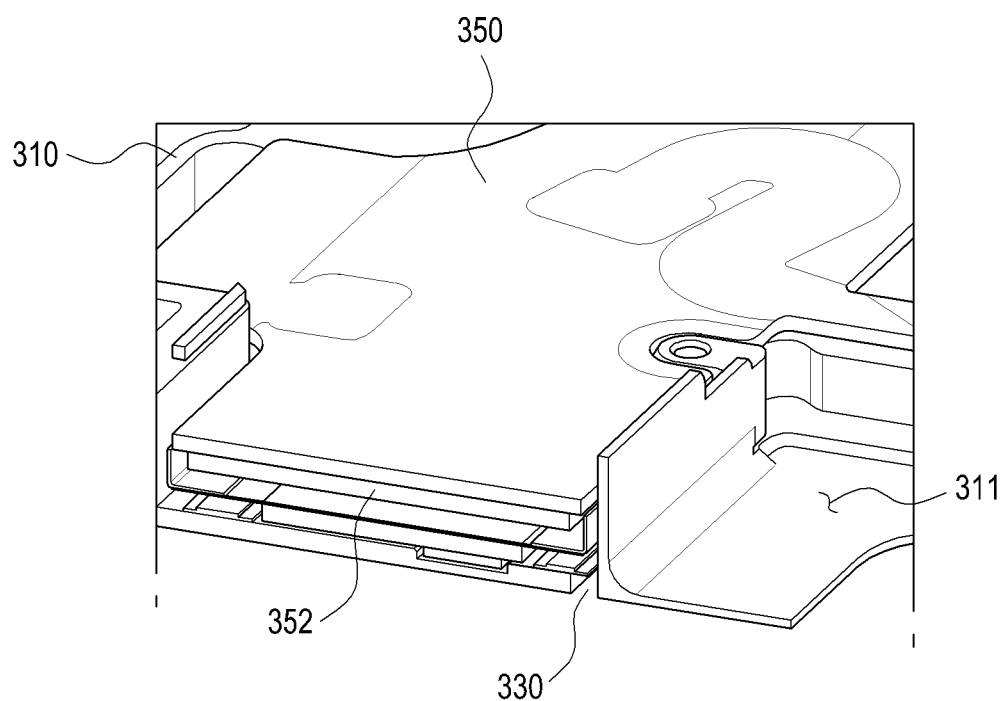
FIG. 5 is a cross-sectional view illustrating electronic parts formed in a bracket and a slit structure according to an embodiment of the present disclosure.

FIG. 5 is a cross-sectional view illustrating electronic parts formed in a bracket 310 and a slit structure according to an embodiment of the present disclosure.

Referring to FIGS. 4 and 5, the bracket 310 and internal components of the electronic device 300 (e.g., 101 of FIG. 1) may at least partially or wholly be the same as the bracket 230 and electronic parts of the electronic device 200 of FIGS. 2A to 2C. FIG. 5 is a side cross-sectional view taken along line A-A' of FIG. 3A.

The battery 370 may be disposed in a first area 311 of the bracket 310, and a printed circuit board 350 including at least one circuit device may be disposed in the second area 312 of the bracket 310. Heat may be generated from some of the circuit devices. The circuit device 352 may be, e.g., at least one chip disposed on the printed circuit board 250, and the circuit device 352 may include a power management integrated circuit (PMIC), a power amplifier (PAM), an AP, a CP, and a charger IC.

According to an embodiment of the present disclosure, at least one slit 330 may be disposed between the circuit device 352 and the battery 370. The boundary area 313 where at least part of the slit 330 is disposed may be disposed in the first area 311 and/or the second area 312, formed in a size corresponding to the length of at least one circuit device 352 or in a length corresponding to the lengthwise direction of the battery 370. For example, a portion of the boundary area 313 may be configured to have a length encompassing multiple circuit devices 352, reducing heat spread from the multiple circuit devices 352 to the battery 370. As another example, another portion of the boundary area 313 may be formed to face at least a lengthwise portion of the battery 370, suppressing an increase in temperature of the battery 370.

According to an embodiment of the present disclosure, the slit 330 may be formed in various positions to reduce heat conduction from at least one circuit device 352 disposed in at least some area of one or more circuit devices 352 or a proximate area thereof to the battery 370. For example, at least one circuit device 352 and the slit 330 may be disposed in the same area. The open or recessed slit 330 may be disposed in a lower portion of the at least one circuit device, allowing heat generated from the circuit device 352 to spread to the lower portion of the circuit device, but not to the battery. As another example, at least one circuit device 352 and the slit 330 may be disposed to at least partially overlap each other. As part of the slit 330 is disposed in the boundary area, and another part is formed in the second area where the circuit device 352 is disposed, heat generated from the circuit device 352 may be restricted from directly spreading to the battery. As another example, the at least one circuit device 352 and the slit 330 may be disposed in different areas not to overlap each other. The circuit device 352 and the slit 330, respectively, may be disposed in the second area 312 and the boundary area 313, blocking the path along which heat generated from the circuit device 352 spreads to the first area 311 where the battery 370 is disposed. Hereinafter, the circuit device and slit arranged in different areas are described in detail.

According to an embodiment of the present disclosure, the slit 330 may be formed of a material with a first thermal conductivity, and the proximate area where the slit 330 is not formed in the bracket 310 may be formed of a material with a second thermal conductivity.

According to an embodiment of the present disclosure, the slit 330 may be disposed on the boundary area 313 in a shape corresponding to the length of the circuit device 352. For example, upon viewing a surface of the bracket 310 that faces in the rear direction (i.e., the second direction −Z of FIGS. 2A to 2C), at least one circuit device 352 may be disposed in the second area 312 that is positioned opposite upper and left areas S3 to S5 of the first area 311 of the bracket 310. The slit 330 disposed between the circuit device 352 and the battery 370 may be sized to correspond to the lengthwise direction from an end of the circuit device 352 to the other so as to block direct heat spread from the circuit device 352 to the first area 311 on the right side.

According to an embodiment of the present disclosure, the slit 330 may be formed in an opening structure, and the slit 330 may be shaped as a line formed along the third direction Y. The slit 330 may be configured to be smaller in size than the battery 370. For example, the circuit devices 352 may include a first circuit device 352*a* disposed adjacent an upper and left area S3 of the first area 311 and a second circuit device 352*b* disposed adjacent the middle of the upper and left end of the first area 311 and/or the lower areas S4 and S5. The first circuit device 352*a* may be the PMIC among the circuit devices disposed on the printed circuit board 350, and the second circuit device 352*b* may be the AP among the circuit devices disposed on the printed circuit board 350. According to an embodiment of the present disclosure, the slit 330 may be sized to encompass the sides of the first circuit device 352*a* and the second circuit device 352*b*. As another example, the slit 330 may be shaped to be partially bent corresponding to each rib structure formed in the bracket 310.

According to an embodiment of the present disclosure, the slit 330 may be formed in an inner surface of the bracket 310 in a recess structure that does not penetrate the outer surface of the bracket 310, and the slit 330 may be shaped as a line formed along the third direction Y. The recessed slit 330 may be sized to encompass the sides of the first circuit device 352*a* and the second circuit device 352*b* and formed in a bent shape corresponding to each rib structure formed in the bracket 310.

However, the shape of the slit 330 is not limited thereto. For example, a portion of the slit 330 may be open while another may be formed with a step (refer to FIG. 11). At least part of the slit 330 may be filled or coated with a thermal conducting member. For example, the thermal conducting member may include a solid-state heat-radiating sheet or a liquid heat-radiating paint.

According to an embodiment of the present disclosure, when viewed from above the electronic device (in the first direction +Z of FIGS. 2A to 2C), the slit 330 may be disposed to overlap the bracket 310 substantially in the entire area. As another example, the slit 330 may be an opening and/or recess partially with a bend, including a first slit area 331 facing a side area of the first circuit device 352*a* and a second slit area 332 facing the second circuit device 352. The first slit area 331 and the second slit area 322 may have different shapes, sizes, depths, directions, and/or thermal conductivities.

According to an embodiment of the present disclosure, the first slit area 331 of the slit 330 may be disposed opposite the first circuit device 352*a* and spaced apart from the first circuit device 352*a* at a predetermined distance, and the first slit area 331 may have a bending portion facing the first circuit device 352*a* to prevent formation of a heat path from the first circuit device 352*a* to the first area 311. The bending portion may include a curve and/or a bend. The first slit area 331 of the slit 330 may be shielded so that heat generated from the first circuit device 352*a* is neither rerouted nor directed to the first area 311.

According to an embodiment of the present disclosure, the second slit area 332 of the slit 330 may be formed to extend from the first slit area 331 or disposed adjacent the second circuit device 352*b*. The length of the second slit area 332 may be formed to correspond to the length of, at least, the second circuit device 352*b*. The second slit area 332 of the slit 330 may be shielded so that heat generated from the second circuit device 352*b* is neither rerouted nor directed to the first area 311. According to an embodiment of the present disclosure, although the opening of the slit 330 is configured in a line shape partially having a bend, embodiments of the present disclosure are not limited thereto, and it may also be designed in other various shapes capable of rerouting or blocking heat spread.

Figure 6A:
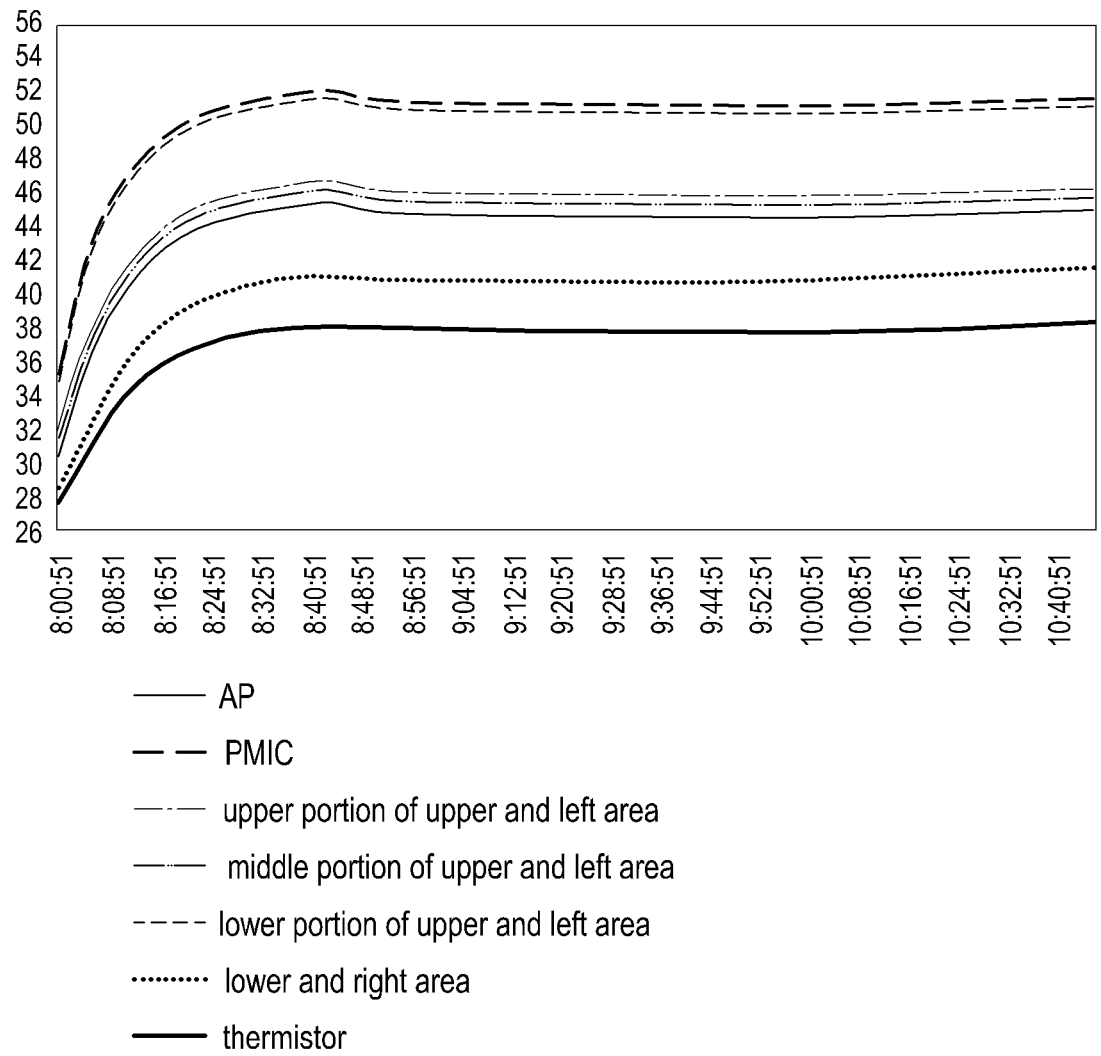
FIGS. 6A and 6B are a graph illustrating variations in temperature per area of a bracket before and after forming a slit according to an embodiment of the present disclosure.
Figure 6B:
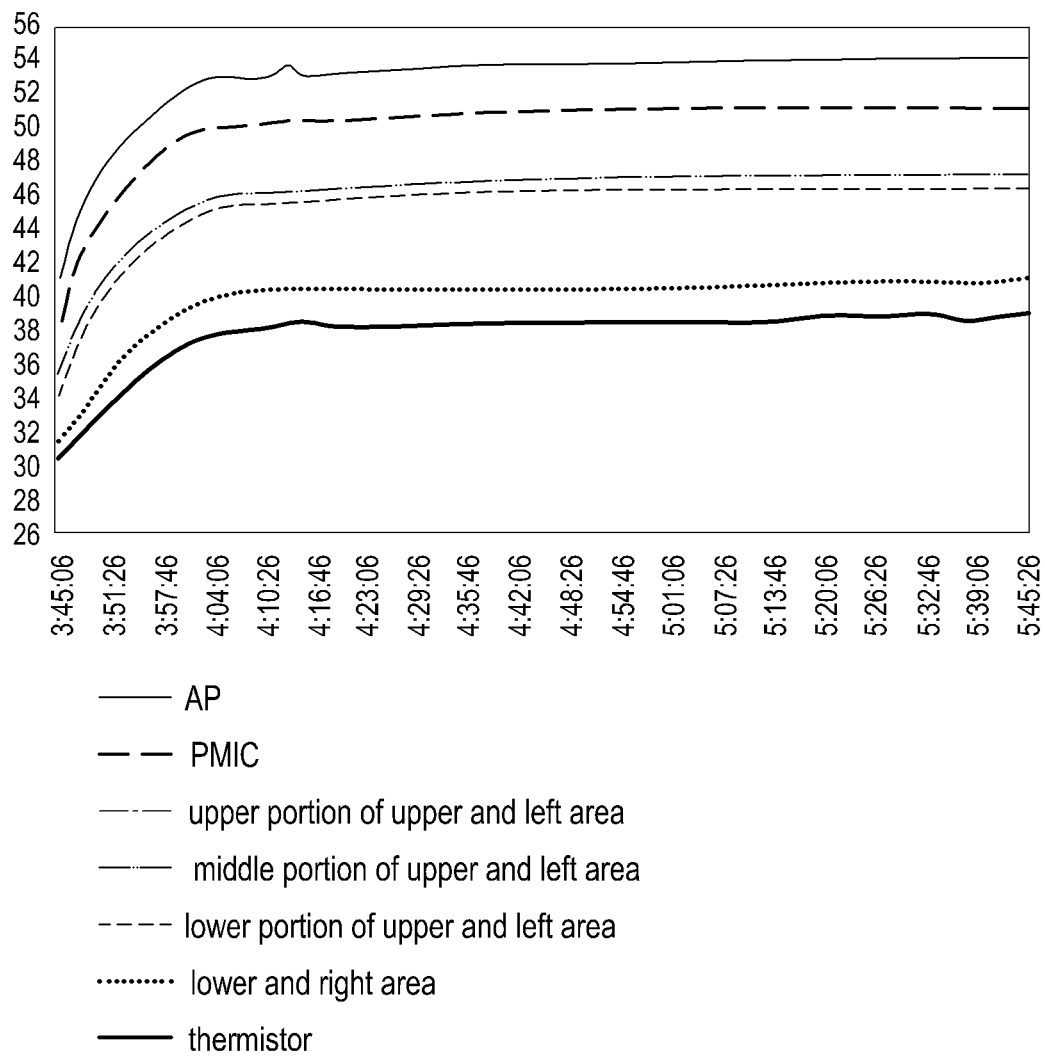

FIGS. 6A and 6B are graphs illustrating variations in temperature per area of a bracket before and after forming a slit according to an embodiment of the present disclosure.

Referring to FIGS. 6A and 6B, a graph before a slit 330 is disposed in a bracket is illustrated in FIG. 6A, and a graph after the slit 330 is disposed in the bracket is illustrated in FIG. 6B. The bracket 310 and internal components of the electronic device 300 shown in FIGS. 6A and 6B may at least partially or wholly be the same as the bracket 230 and electronic parts of the electronic device 200 of FIGS. 2A to 2C.

Table 1 below summarizes comparison of temperature differences before and after modifying the bracket 310 of the electronic device.

TABLE 1

| 1. Environment for measurement | Discharging App | | |
|---|---|---|---|
| 2. Sample conditions | Before modifying bracket | After modifying bracket | Enhancement in temperature Delta (° C.) |
| 3. upper portion of upper and left area in bracket | 47.55 | 46.76 | 0.79 |
| 4. middle portion of upper and left area in bracket | 47.62 | 46.46 | 1.16 |
| 5. lower portion of upper and left area in bracket | 46.95 | 45.72 | 1.23 |
| 6. lower and right area in bracket | 41.68 | 41.8 | −0.12 |
| difference in temperature of battery (upper portion) [3-6] | 5.87 | 4.96 | 0.91 |
| difference in temperature of battery (middle portion) [4-6] | 5.94 | 4.66 | 1.28 |
| difference in temperature of battery (lower portion) [5-6] | 5.27 | 3.92 | 1.35 |
| 7. battery thermistor | 39.44 | 38.47 | 0.97 |

Referring to FIG. 6A and Table 1, the maximum MAX temperature in each position of the bracket 310 may be shown. Refer to the reference denotations Si to S7 in the bracket 310 of FIG. 3A for the numbers 1-7 of FIGS. 6A and 6 and the numbers 1 to 7 of Table 1.

According to an embodiment of the present disclosure, electronic devices may cause an imbalance in charging due to per-position differences in temperature in the battery if the battery is charged in a normal manner according to the related art. For example, where a portion of the battery is higher in temperature than another, the higher-temperature portion may be charged more. As another example, the charging imbalance in the battery may become larger if quick charging is performed on the battery.

As still another example, a temperature difference of 5 degree Celsius or more arising in the position of the battery 370 in the electronic device may cause an excessive imbalance in the amount of energy charged in the battery cell due to the hotter portion that has been charged more. For example, since the electrolyte is first dried in the hotter area of the battery, dendrites may build up due to precipitation of lithium ions in the battery, causing a drop in the electric potential between the positive and negative electrode and resultantly a short circuit.

Referring to FIGS. 3A and 6A and 6B and Table 1, the following temperatures are measured in a slit-free bracket up to 47.55 degrees Celsius at the upper portion S3 of the upper and left area, up to 47.62 degrees Celsius at the middle portion S4 of the upper and left area, up to 46.95 degrees Celsius at the lower portion S5 of the upper and left area, and up to 41.68 degrees Celsius in the lower and right area of the bracket. The rise in temperature stems from direct transfer of heat from the circuit devices to the battery.

As set forth above, the upper portion S3, middle portion S4, and lower portion S5 of the upper and left area to which the heat has directly been delivered from the circuit device (e.g., the AP and PMIC) are measured relatively high in temperature as compared with the other areas. The lower and right area S6 in the bracket to which the heat has not directly been delivered from the circuit device may be measured relatively low in temperature as compared with the other areas.

Differences in temperature per position in the battery may be verified as follows about 5.87 degrees Celsius between the upper portion S3 of the upper and left area and the lower and right area S6, about 5.94 degrees Celsius between the middle portion S4 of the upper and left area and the lower and right area S6, and about 5.27 degrees Celsius between the lower portion S5 of the upper and left area and the lower and right area S6. The differences in temperature are ones in each position of the battery. As a high temperature occurs in all the areas adjacent to the circuit device, the range has been verified that may cause an imbalance in battery charging.

Referring back to FIGS. 3A and 6A and 6B and Table 1, the following temperatures are measured in a slit bracket up to 46.76 degrees Celsius at the upper portion S3 of the upper and left area, up to 46.46 degrees Celsius at the middle portion S4 of the upper and left area, up to 46.95 degrees Celsius at the lower portion S5 of the upper and left area, and up to 41.8 degrees Celsius in the lower and right area of the bracket. As such, forming the slit 330 in the bracket may present the effect of reducing the temperature by 0.79 degrees Celsius at the upper portion S3 of the upper and left area of the bracket, 1.16 degrees Celsius at the middle portion S4 of the upper and left area, and 1.23 degrees Celsius at the lower portion S5 of the upper and left area. Further, the lower and right area S6 of the bracket may be increased by 0.12 degrees Celsius, maximizing the temperature differences in the positions.

When the bracket has a slit, differences in temperature per position in the battery may be verified as follows about 4.96 degrees Celsius between the upper portion S3 of the upper and left area and the lower and right area S6, about 4.66 degrees Celsius between the middle portion S4 of the upper and left area and the lower and right area S6, and about 3.92 degrees Celsius between the lower portion S5 of the upper and left area and the lower and right area S6. Since the temperature differences correspond to the per-position temperature differences in the battery, it can be verified that the slit bracket produces reduced temperature differences as compared with the slit-free bracket. For example, the temperature differences may be adjusted to be less than 5 degrees Celsius which are per-position temperature differences in the battery that fall within a range of question.

According to an embodiment of the present disclosure, the open slit in the enhanced structure may block or reroute the heat that spreads to the upper side area of the battery and may lead to the distribution or spread of heat, lowering the temperature in the upper side portion of the battery in the electronic device. This diminishes per-position temperature differences in the battery to resolve an imbalance in energy charged in the battery cell, enhancing battery stability and performance.

Figure 7:
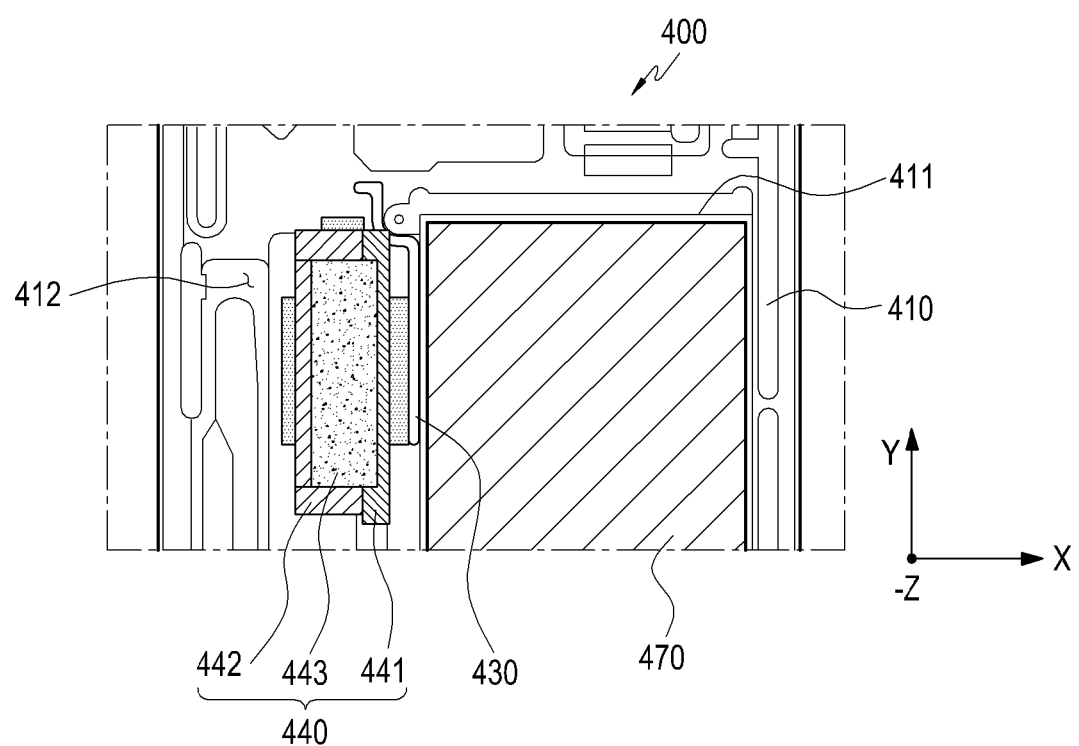
FIG. 7 is a front view schematically illustrating a bracket including a heat spreading structure according to an embodiment of the present disclosure.

FIG. 7 is a front view schematically illustrating a bracket including a heat spreading structure according to an embodiment of the present disclosure.

Figure 8:
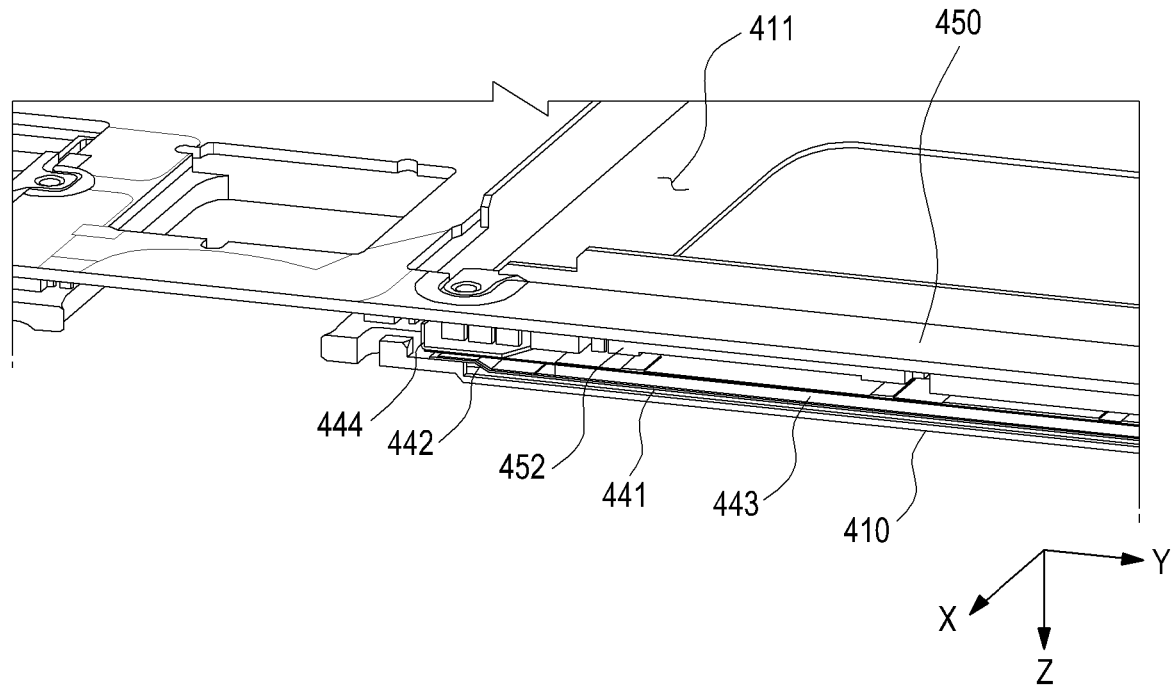
FIG. 8 is a side cross-sectional view illustrating a bracket with a heat spreading structure according to an embodiment of the present disclosure.

FIG. 8 is a side cross-sectional view illustrating a bracket including a heat spreading structure according to an embodiment of the present disclosure.

Figure 9:
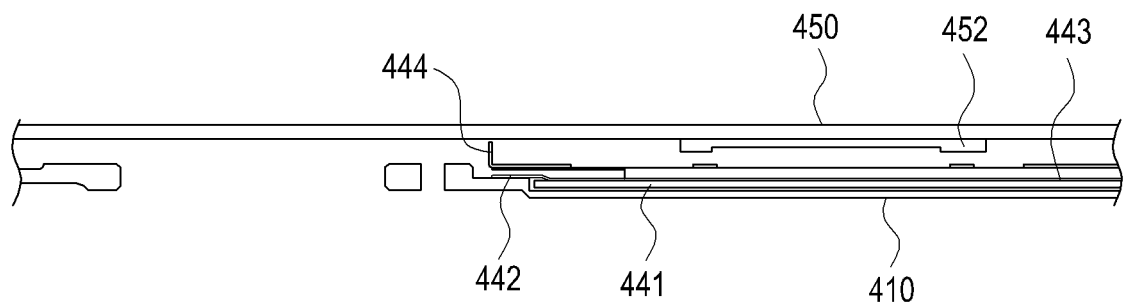
FIG. 9 is a side cross-sectional view illustrating a heat spreading path of a bracket 410 with a heat spreading structure by the heat spreading structure.

FIG. 9 is a side cross-sectional view illustrating a heat spreading path of a bracket with a heat spreading structure by the heat spreading structure according to an embodiment of the present disclosure.

Referring to FIGS. 7 to 9, a bracket 410 and internal components of the electronic device may at least partially or wholly be the same as the bracket 230 and electronic parts of the electronic device 200 of FIGS. 2A to 2C and FIG. 5.

Referring to FIGS. 7 and 8, a battery 470 may be disposed in a first area 411 of the bracket 410 in the electronic device, and a printed circuit board 450 including at least one circuit device may be disposed in the second area 412. A slit 430 may be provided in at least a portion of a boundary area of the first area 411 and the second area 412.

According to an embodiment of the present disclosure, at least one heat conducting member 440 may be provided in at least a portion of the second area 412 to prevent heat radiation from the circuit device 452 from conducting to the first area 411. For example, the at least one heat conducting member 440 may be disposed adjacent the circuit device 452 and formed in a shape corresponding to the length of the circuit device 452.

According to an embodiment of the present disclosure, the heat conducting member 440 may be disposed between the printed circuit board 450 and the bracket 410. A plurality of heat conducting members 440 may be configured. For example, the plurality of heat conducting members 440 may be arranged in the first direction +Z of the circuit device 452 to prevent the circuit device 452 from directly contacting or facing the bottom surface of the metallic bracket 410. The circuit device 452 may be at least one chip disposed on, e.g., the printed circuit board 250, and the circuit device 452 may include, e.g., a PMIC, a PAM, an AP, a CP, and/or a charger IC.

According to an embodiment of the present disclosure, the heat conducting members 440 may be stacked on multiple layers on the rear surface (in the first direction +Z of the circuit device 452) of the circuit device 452. For example, the circuit device 452 may be the second circuit device 352b of FIG. 4, and the circuit device 452 may electrically be connected with a lower portion of the printed circuit board 450. As another example, the plurality of heat conducting members 440 may be formed of a high thermal conducting material to increase the heat spread from the circuit device 452 to the upper and/or lower end of the circuit device 452, but not to the battery, suppressing excessive heat concentration onto the first area 411 and a rise in temperature. The heat conducting members 440 may include, e.g., a thermal interface material (TIM), a heat pipe, a shield can, a solid-state heat-radiating sheet, or a liquid heat-radiating paint. Here, the heat pipe, solid-state heat-radiating sheet, or the liquid heat-radiating paint may include, e.g., graphite, carbon nano tube (CNT), natural recyclable substance, silicone, silicon, or other high thermal conducting substance.

According to an embodiment of the present disclosure, a first heat conducting member 441 may be disposed in the second area 412 facing in the first direction +Z, spaced apart at a predetermined interval. The first heat conducting member 441 may be a heat pipe. When viewed from above the electronic device, the first heat conducting member 441 may be sized to encompass the circuit device 452, overlapping the circuit device 452. A surface of the first heat conducting member 441 may be disposed at a predetermined gap or in contact with the circuit device 452 or another heat conducting member 440. Another surface of the first heat conducting member 441 may be disposed at a predetermined gap or in contact with the bracket 410. The gap may be provided to enable heat from the circuit device 452 to initially spread via the gap but rather than directly passing through the first heat conducting member 441. Accordingly, the heat initially spread may be evenly distributed in contact over the entire surface of the first heat conducting member 441, thereby maximizing the effect of spreading. As another example, the heat from the first heat conducting member 441 may spread through another gap to another area (except for the first area 411) of the bracket 410 along a path.

According to an embodiment of the present disclosure, a second heat conducting member 442 may be disposed on the upper surface of the first heat conducting member 441 that is disposed in the second area 412 of the bracket 410. The second heat conducting member 442 may include graphite, and the second heat conducting member 442 may be configured as a sheet sized to encompass the area of the circuit device 452. The second heat conducting member 442, as viewed from above the upper surface of the electronic device, may overlap the circuit device 452.

According to an embodiment of the present disclosure, a third heat conducting member 443 may be disposed on the upper surface of the second heat conducting member 442 that is disposed in the second area 412 of the bracket 410. The third heat conducting member 443 may include a TIM, and the third heat conducting member 443 may be configured as a sheet sized to encompass the area of the circuit device 452. The third heat conducting member 443, as viewed from above the upper surface of the electronic device, may overlap the circuit device 452. A shield can 444 may be disposed in contact on the third heat conducting member 443. The circuit device 452 disposed on the printed circuit board 450 may be housed in the shield can 444.

According to an embodiment of the present disclosure, the heat conducting member 440 may be disposed adjacent the slit 430. As in the example set forth above, a plurality of heat conducting members may be stacked one over another, or only one of the heat conducting members may be provided. However, embodiments of the present disclosure are not limited to the above structure. The heat conducting member may be designed in various shapes in an area where the circuit device 452 is disposed or in a peripheral area of the slit 430.

Referring to FIG. 9, at least one heat conducting member 440 formed around the circuit device 452 may reroute the path along which heat from the circuit device 452 spreads to the lower area of the bracket 410. For example, heat radiated from the circuit device 452 may form a path along the direction where the heat conducting member 440 is disposed. Thereafter, the heat may spread in the lower direction −Z along the shield can 444, the third heat conducting member 443, the second heat conducting member 442, and the first heat conducting member 441 to the space between the first heat conducting member 441 and the bracket 410.

Accordingly, a significant amount of heat may be spread to the areas other than the first area 411 where the battery 470 is disposed, reducing a rise in temperature in the upper area of the battery and stabilizing battery performance.

Figure 10:
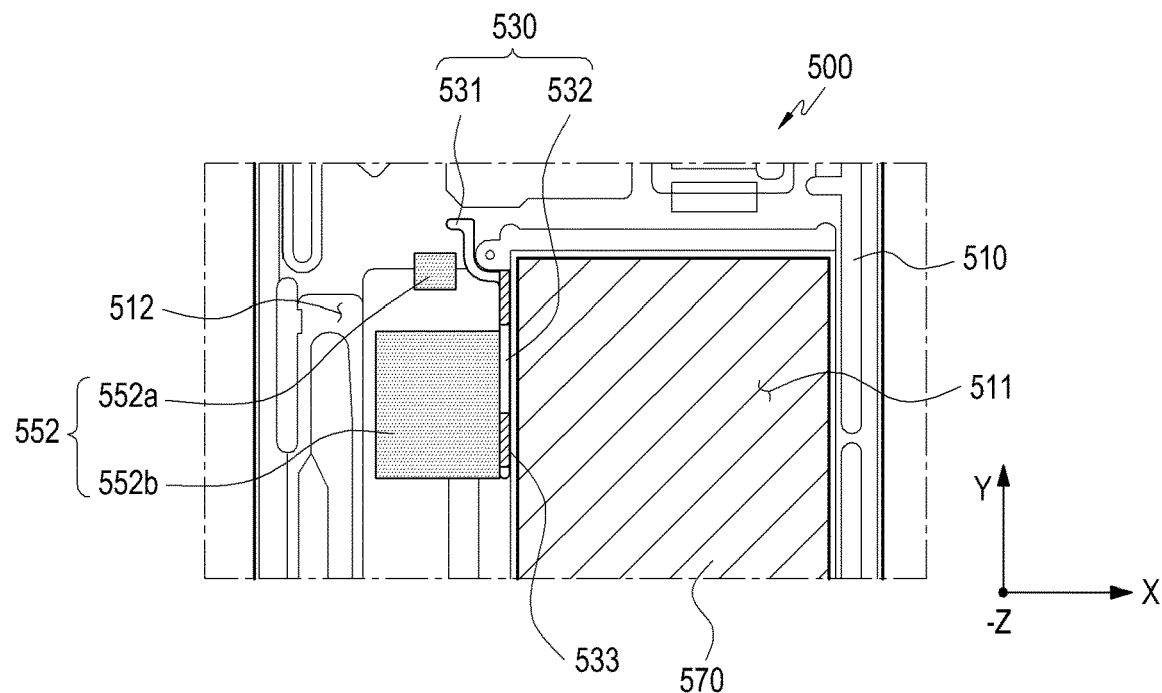
FIG. 10 is a front view schematically illustrating a slit structure formed in a bracket 510 according to an embodiment of the present disclosure.

FIG. 10 is a front view schematically illustrating a slit structure formed in a bracket according to an embodiment of the present disclosure.

Figure 11:
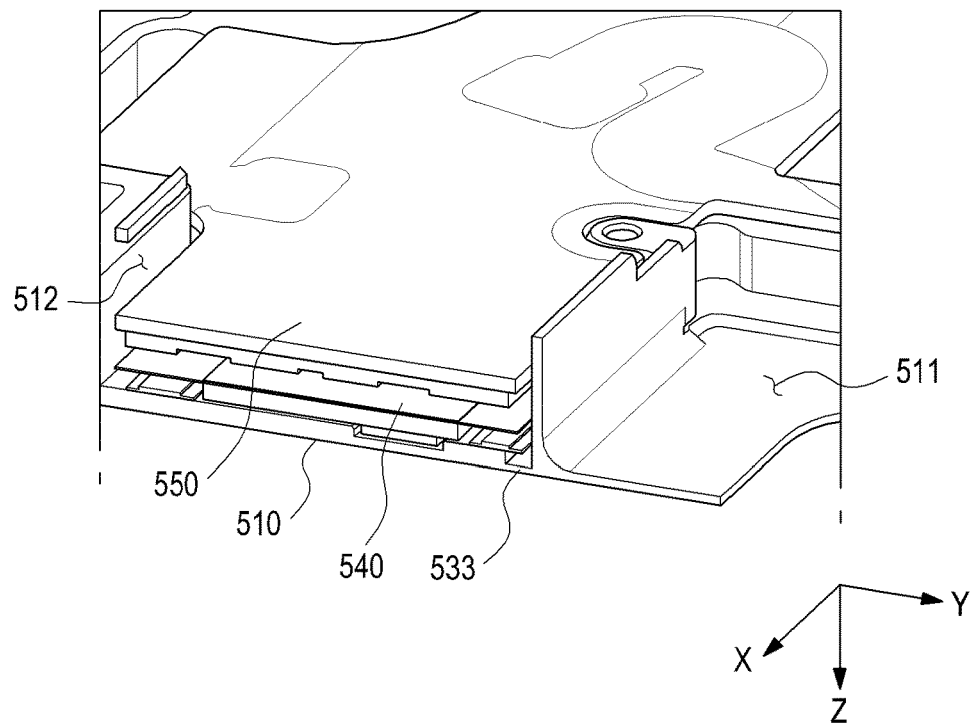
FIG. 11 is a side cross-sectional view illustrating a slit structure formed in a bracket 510 according to an embodiment of the present disclosure.

FIG. 11 is a side cross-sectional view illustrating a slit structure formed in a bracket according to an embodiment of the present disclosure.

Figure 12:
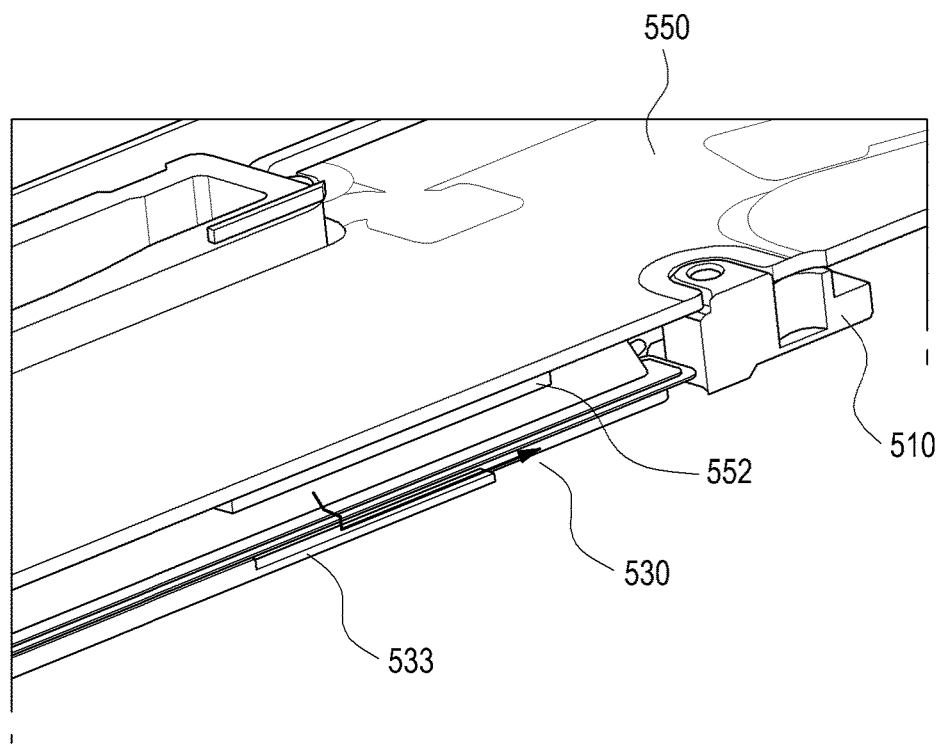
FIG. 12 is a side cross-sectional view illustrating a heat spreading path by a slit structure formed in a bracket according to an embodiment of the present disclosure.

FIG. 12 is a side cross-sectional view illustrating a heat spreading path by the slit structure formed in a bracket according to an embodiment of the present disclosure.

Referring to FIGS. 10 to 12, a bracket 510 and internal components of an electronic device 500 (e.g., 101 of FIG. 1) may at least partially or wholly be the same as the bracket 230 and electronic parts of the electronic device 200 of FIGS. 4 and 5.

Referring to FIGS. 10 and 11, a battery 570 may be disposed in a first area 511 of the bracket 510 in the electronic device, and a printed circuit board 550 including at least one circuit device may be disposed in the second area 512. A slit 530 may be provided in at least a portion of a boundary area of the first area 511 and the second area 512.

According to an embodiment of the present disclosure, the slit 530 may, at least partially, be formed in an inner surface of the bracket 510 in a recess structure that does not penetrate the outer surface of the bracket 510. For example, at least one step may be formed in a portion of the slit structure, providing for a path along which air may flow. The air flow via the step may reroute the heat transfer path or suppress the heat flow to the battery 570 disposed in the first area 511.

According to an embodiment of the present disclosure, at least one stepped slit 530 may be disposed between the at least one circuit device 552 and the battery 570. The slit 530 may be formed in a shape corresponding to the end-to-end length of the at least one circuit device 552. For example, at least one circuit device 552 may be disposed in a second area 512 that faces the upper and left area (refer to S3 to S5 of FIGS. 3A and 3B) of the first area 511 of the bracket 510. The slit 530 disposed between the circuit device 552 and the battery 570 may block direct heat spread from the circuit device 552 to the first area 511 on the right side.

According to an embodiment of the present disclosure, the slit 530 may be formed as an opening partially bent, including a first slit area 531 facing a side area of the first circuit device 552a and a second slit area 532 facing the second circuit device 552b. For example, the first slit area 531 and second slit area 532 of the slit 530 may overall be formed as an open space, at least a portion of which may be formed as a third slit area 533 that, with no opening, is stepped from the other areas.

According to an embodiment of the present disclosure, the third slit area 533 may be shaped as a plate with a predetermined height from the first slit area 531 and second slit area 532 of the slit 530, actively leading to the heat or air spread to the first slit area 531 and the second slit area 532. For example, the stepped third slit area 533 in the slit 530 may cause a deviation in air density with respect to the first slit area 531 and/or the second slit area 532, inducing a more powerful air flow as per the density.

According to an embodiment of the present disclosure, a plurality of stepped third slit areas 533 may be configured in a portion of the first slit area 531 of the slit 530 or a portion of the second slit area 532 of the slit 530.

According to an embodiment of the present disclosure, forming a heat conducting member 540 around the circuit device 352 described above, along with the structure of the third slit area 533 formed in the slit 530, may further reduce the heat delivered to the battery 570. The specific configuration of the heat conducting member 540 has been described above, and no further detailed description thereof is given below.

Referring to FIG. 12, the step structure formed in the slit 530 may reroute the spreading path of heat from the circuit device 552 to the lower area of the bracket 510. For example, the heat radiated from the circuit device 552 may be rerouted to the lower area of the bracket 510 by the open slit 530 while conducting to the battery 570 and the bracket 510. The step may prompt the heat spread more quickly. Generally, heat spreads from a higher thermal energy portion in the air to a lower thermal energy portion. An air flow may arise from the narrow space with the step structure to a broader space of the open slit 530. Accordingly, a significant amount of heat may be spread to the areas other than the first area 511 where the battery 570 is disposed, reducing a rise in temperature in the upper area of the battery and stabilizing battery performance.

Figure 13:
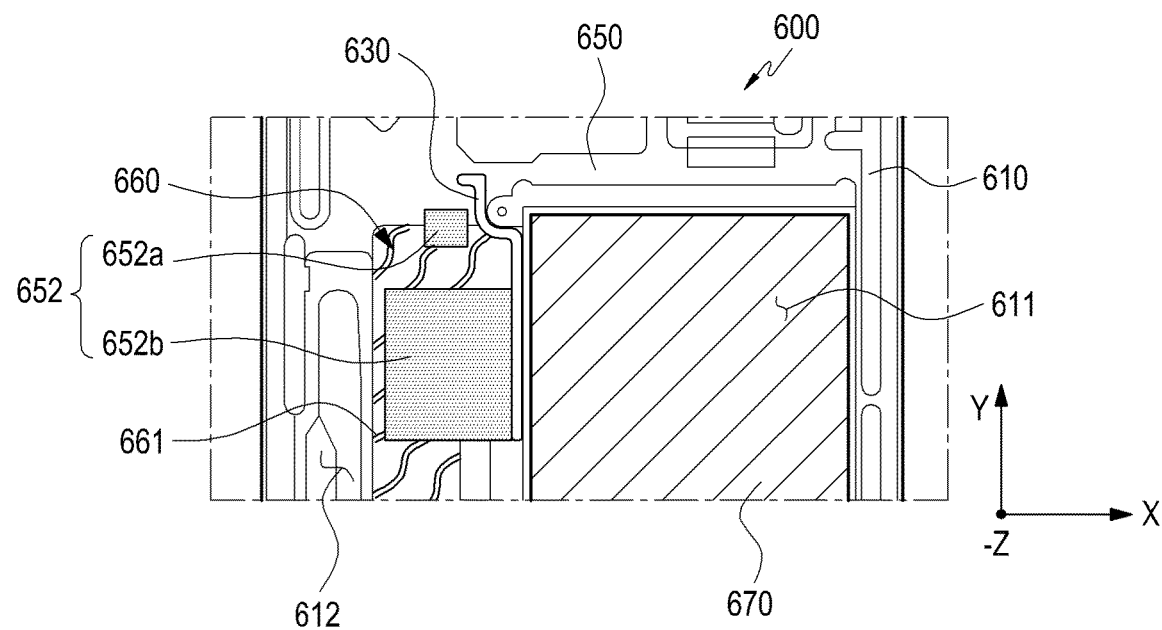
FIG. 13 is a front view schematically illustrating a heat-radiating structure formed in a second area of a bracket according to an embodiment of the present disclosure.

FIG. 13 is a front view schematically illustrating a heat-radiating structure formed in a second area of a bracket according to an embodiment of the present disclosure.

Referring to FIG. 13, a bracket 610 and internal components of the electronic device 600 (e.g., 101 of FIG. 1) may at least partially or wholly be the same as the bracket 230 and electronic parts of the electronic device 200 of FIGS. 4 and 5.

A battery 670 may be disposed in a first area 611 of the bracket 610 in the electronic device 600, and a printed circuit board 650 including at least one circuit device may be disposed in a second area 612. A slit 630 may be provided in at least a portion of a boundary area of the first area 611 and the second area 612.

According to an embodiment of the present disclosure, a heat-radiating structure with a bent surface may be formed in the second area 612 of the bracket 610 to suppress a rise in temperature due to heat generated from the circuit device 652. For example, in the heat-radiating structure 660, a recess 661 may be formed in at least a portion of an area where at least one heat-radiating circuit device of the one or more circuit devices in the second area 612 is disposed. The recess 661 may be implemented in various shapes, such as a hair line shape, a protrusion-and-depression shape, or a shape in which the surface area may be expanded. The heat-radiating structure 660 of the bracket 610 may be formed by extrusion, laser cutting, or computer numerical control (CNC) processing to form the recess 661 in the hair line shape or protrusion-and-depression shape.

According to an embodiment of the present disclosure, the heat-radiating structure 660 of the bracket 610 may be formed on the whole or partial surface of the portion of the second area 612 where the printed circuit board 650 is disposed, effectively spreading heat generated from each circuit device on the printed circuit board 650. As another example, the heat-radiating structure 660 of the bracket 610 may be concentrated in the lower portion of the second area 612 under a major circuit device 652 where a significant rise in temperature occurs in the printed circuit board 650. As another example, the heat-radiating structure 660 of the bracket 610 may be formed on the overall area where the printed circuit board 650 is disposed while the recess 661, such as a hair line shape narrower than the other areas, may be formed in the lower portion of the major circuit device 652. According to an embodiment of the present disclosure, the circuit device 652 may include, e.g., a PMIC, a PAM, an AP, a CP, and/or a charger IC. The circuit device 652 may include a side area of a first circuit device 652a and a second circuit device 652b.

According to an embodiment of the present disclosure, the heat-radiating structure 660 of the bracket 610 may be formed adjacent the open slit 630, increasing the speed of air flow and reinforcing the formation of a turbulence by the recess. Accordingly, the heat generated from the printed circuit board 650 may be spread over the area increased by the recess, enhancing the air circulation structure and diminishing heat. The structure of the slit 630 may be formed according to the above-described embodiments.

According to an embodiment of the present disclosure, a heat-radiating lubricant or gel may be applied on the surface of the heat-radiating structure 660 of the bracket 610, reinforcing the heat-radiating effects. Although the heat-radiating structure 660 is formed in the second area 612 in the above embodiment of the present disclosure, embodiments of the present disclosure are not limited thereto. For example, the heat-radiating structure may be formed in at least a portion of the first area where the battery from which heat is required to spread is disposed, providing for an effective heat-radiating capability.

Figure 14:
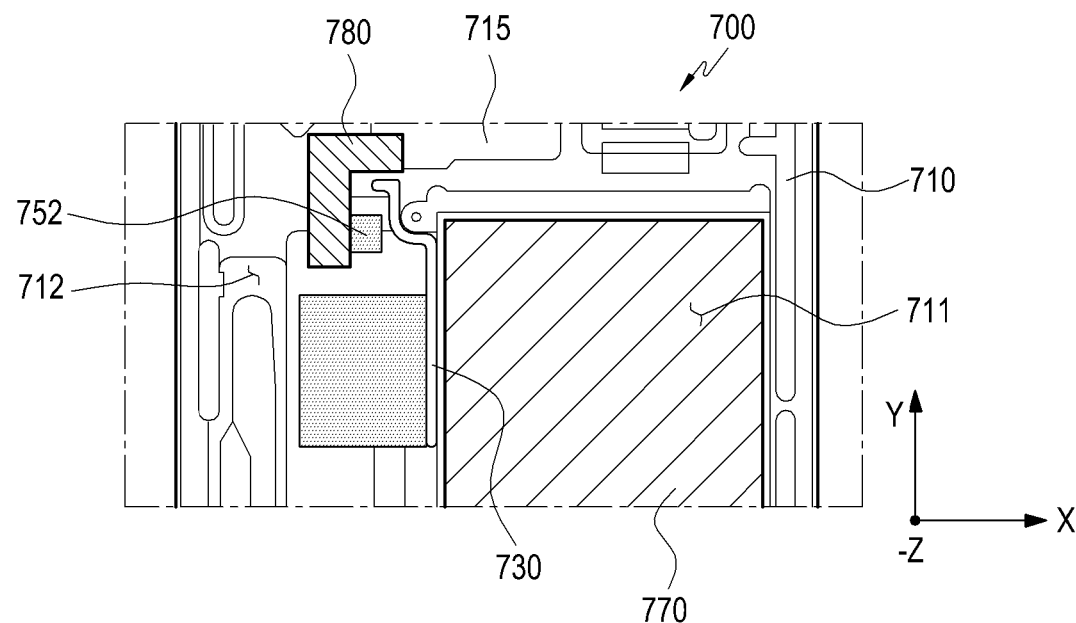
FIG. 14 is a front view schematically illustrating a heat dissipating structure formed in a second area of a bracket according to an embodiment of the present disclosure.

FIG. 14 is a front view schematically illustrating a heat dissipating structure formed in a second area of a bracket according to an embodiment of the present disclosure.

Figure 15:
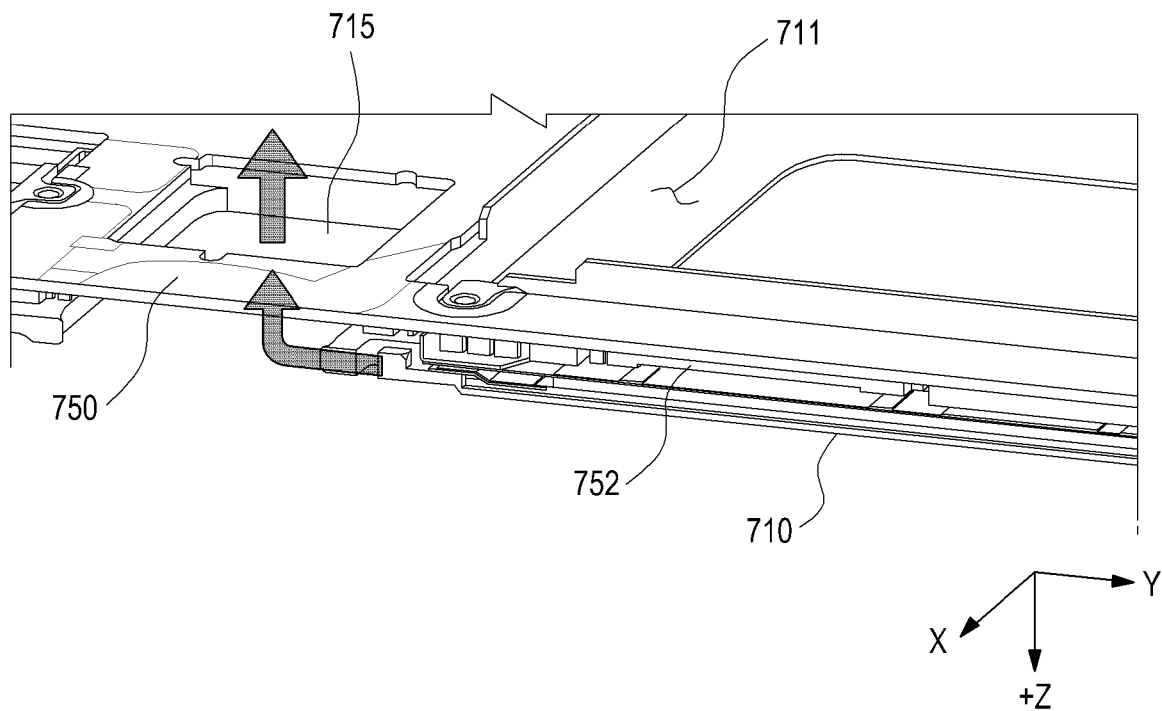
FIGS. 15 and 16A, 16B, and 16C, respectively, are a cross-sectional view and flowchart illustrating a heat spreading path by a heat dissipating structure formed in a second area of a bracket according to an embodiment of the present disclosure.
Figure 16A:
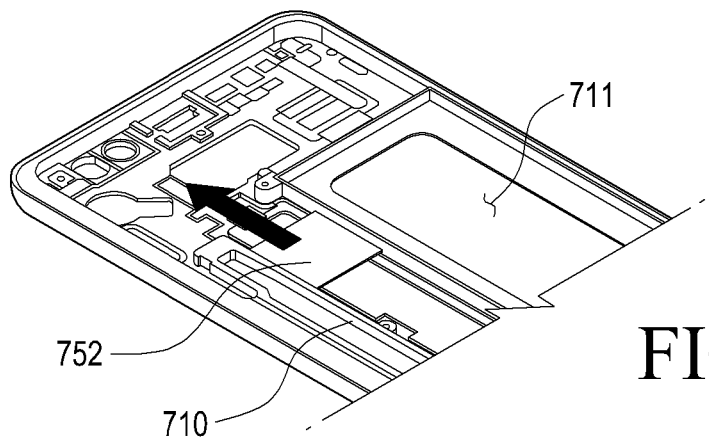
Figure 16B:
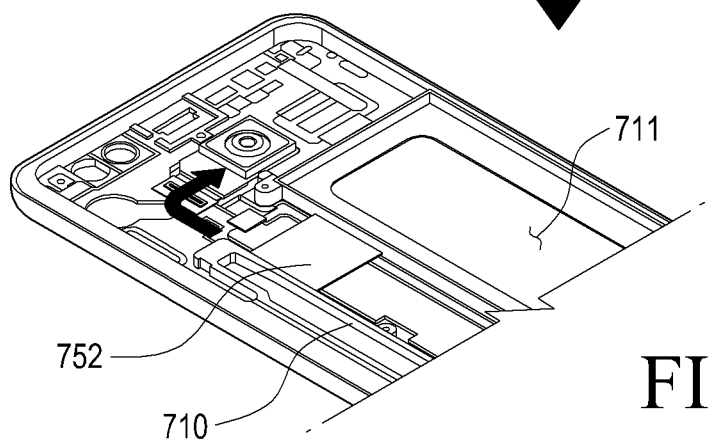
Figure 16C:
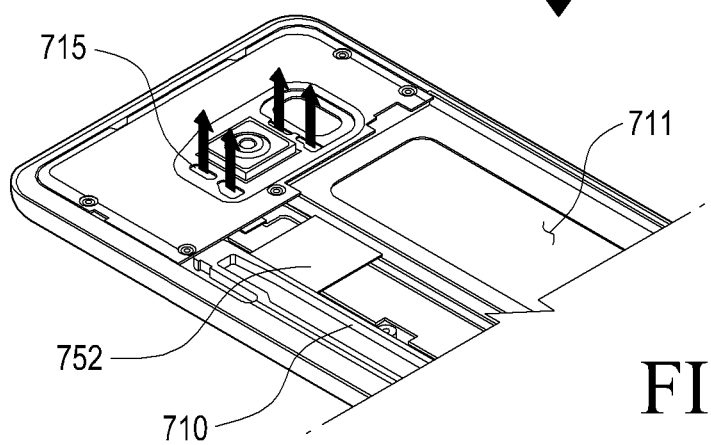

FIGS. 15 to 16C, respectively, are a cross-sectional view and flowchart illustrating a heat spreading path by a heat dissipating structure formed in a second area of a bracket according to an embodiment of the present disclosure.

Referring to FIGS. 14 to 16C, a bracket 710 and internal components of an electronic device 700 (e.g., 101 of FIG. 1) may at least partially or wholly be the same as the bracket 230 and electronic parts of the electronic device 200 of FIGS. 4 and 5.

Referring to FIG. 14, a battery 770 may be disposed in a first area 711 of the bracket 710 in the electronic device, and a printed circuit board 750 including at least one circuit device may be disposed in the second area 712. A slit 730 may be provided in a boundary area of the first area 711 and the second area 712, and at least one heat-dissipating structure 780 may be provided on a side surface of the slit 730.

According to an embodiment of the present disclosure, the heat-dissipating structure 780 may be formed in the second area 712 of the bracket 710. An end of the heat-dissipating structure 780 may be disposed adjacent the slit 730 or the circuit device 752, and the other end may be disposed adjacent a hole 715 that is externally open. For example, the heat-dissipating structure 780 may be a duct structure that provides a heat transfer path along which heat generated from the inside of the electronic device may be discharged to the outside. As another example, the heat-dissipating structure 780 may be shaped as a hose that have openings in both ends thereof and a bend to prevent it from overlapping a rib or other structure formed inside the bracket 710.

According to an embodiment of the present disclosure, an end of the heat-dissipating structure 780 may be disposed adjacent the slit 730, forming an inlet for heat delivered through the slit 730. As another example, an end of the heat-dissipating structure 780 may be disposed adjacent the circuit device 752, so that heat generated from the circuit device 752 is not delivered to the other areas but directly to the inside of the heat-dissipating structure 780. However, the end of the heat-dissipating structure 780 is not limited as being so disposed, e.g., the end of the heat-dissipating structure 780 may be disposed in other various places where heat spread is required. A plurality of ends may be formed in the heat-dissipating structure 780.

According to an embodiment of the present disclosure, the other end of the heat-dissipating structure 780 may be disposed to connect to various holes that are directed to the outside of the electronic device. The various holes may include a camera hole formed in the front and/or rear surface of the electronic device or a keypad hole formed in the front and/or side surface of the electronic device. For example, where the other end of the heat-dissipating structure 780 is disposed to face the camera hole, a member to cover the camera hole 715 may be formed of a material that enables heat or air circulation while blocking the flow of a fluid, e.g., water. Accordingly, the heat-dissipating structure 780 connected to the camera hole may provide a heat spreading effect along with waterproof functionality.

Referring to FIGS. 15 to 16C, the heat-dissipating structure 780 formed in the second area 712 of the bracket 710 allows for easier discharge of heat from the circuit device 752 to the outside. For example, heat generated form the major circuit device 752 on the printed circuit board 750 may enter the hole formed in an end of the heat-dissipating structure 780 (FIG. 16A). The heat entering the inside of the heat-dissipating structure 780 may travel along the path formed by the heat-dissipating structure 780 (FIG. 16B). Since the other end of the heat-dissipating structure 780 connects to the surroundings of the camera hole 715, the heat may be discharged to the surroundings of the hole. The heat discharged to the surroundings of the camera hole may be exhausted to the outside along the camera hole (FIG. 16C). Accordingly, a significant amount of heat may be spread to the areas other than the first area 711 where the battery 770 is disposed, reducing a rise in temperature in the upper area of the battery and stabilizing battery performance.

Figure 17:
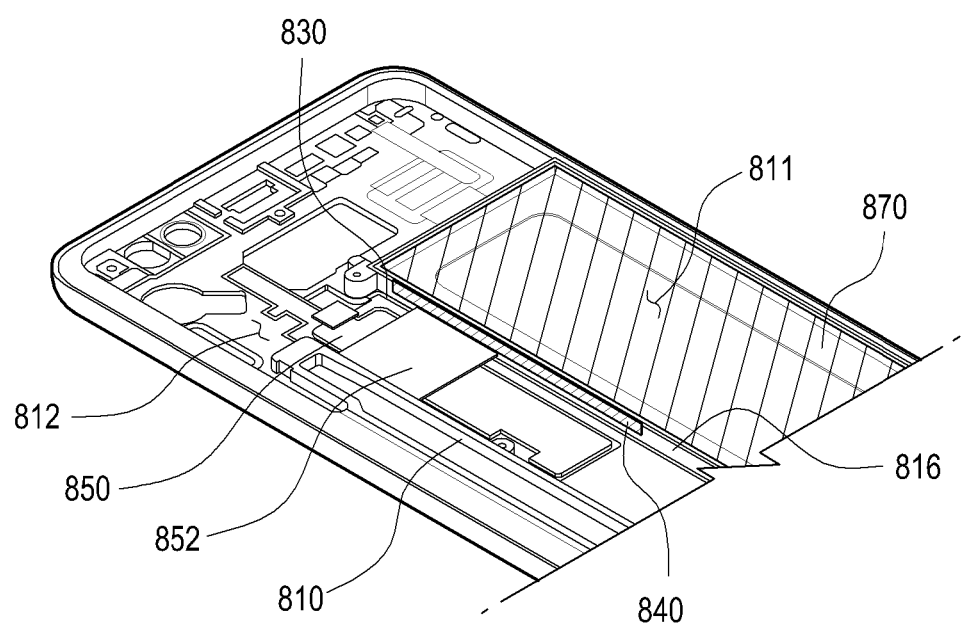
FIG. 17 is a perspective view schematically illustrating a heat conducting member formed in a shielding wall formed in a bracket according to an embodiment of the present disclosure.

FIG. 17 is a perspective view schematically illustrating a heat conducting member formed in a shielding wall formed in a bracket according to an embodiment of the present disclosure.

Referring to FIG. 17, a bracket 810 and internal components of the electronic device may at least partially or wholly be the same as the bracket 230 and electronic parts of the electronic device 200 of FIGS. 4 and 5.

A battery 870 may be disposed in a first area 811 of the bracket 810 in the electronic device, and a printed circuit board (not shown) including at least one circuit device may be disposed in a second area 812. A slit 830 may be provided in a boundary area of the first area 811 and the second area 812.

According to an embodiment of the present disclosure, at least one shielding wall 816 may be formed to partition the battery 870 seated in the first area 811 from the printed circuit board 850 seated in the second area 812 between the first area 811 and the second area 812. The shielding wall 816 may be formed as high as the thickness of the battery 870 to stably dispose the battery 870, and the shielding wall 816 may be shaped as a closed loop to surround the battery.

According to an embodiment of the present disclosure, the shielding wall 816 may be formed of the same material as the bracket 810 to enable heat spread from the circuit device 852 disposed in the second area 812 to the battery 870 disposed in the first area 811. According to the present disclosure, a heat conducting member 840 may be disposed opposite, and in contact with, the shielding wall 816 to suppress heat spread from the circuit device 852 directly to the battery in the first area 811. The heat conducting member 840 may be formed of a material capable of spreading the heat from the circuit device 852 to the surroundings, and the heat conducting member 840 may include, e.g., a heat pipe, a solid-state heat-radiating sheet, or a liquid heat-radiating paint. Here, the heat pipe, solid-state heat-radiating sheet, or the liquid heat-radiating paint may include, e.g., graphite, CNT, natural recyclable substance, silicone, silicon, or other high thermal conducting substance. As another example, the heat conducting member 840 may be shaped as a sheet disposed in contact with the wall 816 and may be attached onto a surface that faces the first area 811. The heat conducting member 840 may also be attached onto a surface that faces the second area 812, reinforcing the heat-spreading effects.

According to an embodiment of the present disclosure, the heat conducting member 840 with the shielding wall 816 disposed therein may be disposed adjacent the slit 830. First, a heat path from the circuit device 852 to the slit 830 may be formed to prevent the heat from being directed to the battery 870. Part of the heat facing the battery 870 may be spread to the surroundings through the heat conducting member 840. Accordingly, a significant amount of heat may be spread to the areas other than the first area 811 where the battery 870 is disposed, reducing a rise in temperature in the upper area of the battery and stabilizing battery performance.

Figure 18:
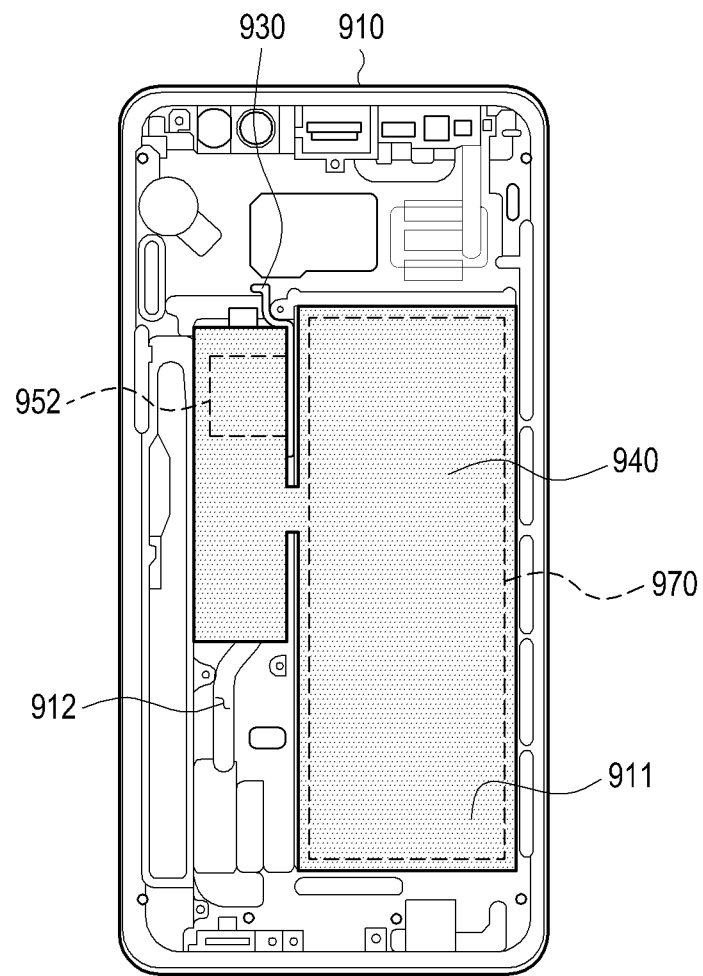
FIG. 18 is a front view schematically illustrating a heat conducting member formed in at least a portion of a surface of a bracket according to an embodiment of the present disclosure.

FIG. 18 is a front view schematically illustrating a heat conducting member formed in at least a portion of a surface of a bracket according to an embodiment of the present disclosure.

Referring to FIG. 18, a bracket 910 and internal components of the electronic device may at least partially or wholly be the same as the bracket 230 and electronic parts of the electronic device 200 of FIGS. 4 and 5.

A battery 970 may be disposed in a first area 911 of the bracket 910 in the electronic device, and a printed circuit board 950 including at least one circuit device may be disposed in the second area 912. A slit 930 may be provided in a boundary area of the first area 911 and the second area 912.

According to an embodiment of the present disclosure, a heat conducting member 940 may be disposed on surfaces of the first area 911 and the second area 912 of the bracket 910. The heat conducting member 940 disposed on the second area 912 may include a TIM, a heat pipe, a shield can, a solid-state heat-radiating sheet, or a liquid heat-radiating paint according to the above-described embodiments. As another example, the heat conducting member 940 may be disposed on substantially the overall area of the second area 912. The heat conducting member 940 may be disposed in at least a portion of a surface inside the seating hole where the battery 970 is seated, effectively spreading to the inside of the electronic device heat radiation that occurs as the temperature of battery rises. The heat conducting member 940 disposed in the first area 911 may include a TIM, a heat pipe, a solid-state heat-radiating sheet, or a liquid heat-radiating paint.

According to an embodiment of the present disclosure, the heat conducting member 940 disposed in the first area 911 may be disposed adjacent the slit 930. First, a heat path from the circuit device 952 to the slit 930 may be formed to prevent the heat from being directed to the battery 970. Part of the heat delivered to the battery 970 may be spread to the surroundings through the heat conducting member 940 disposed in at least a portion of a surface of the battery 970. Accordingly, heat arriving at the battery 970 may be spread, reducing a rise in temperature in the upper area of the battery and stabilizing battery performance.

According to an embodiment of the present disclosure, a portable communication device may comprise a battery (e.g., 370 of FIG. 3), a printed circuit board (e.g., 350 of FIG. 3) including one or more circuit devices driven using power from the battery, and a bracket (e.g., 310 of FIG. 3) including a first area (e.g., 311 of FIG. 3) for receiving the battery and a second area (e.g., 312 of FIG. 3) for receiving the printed circuit board, wherein a slit (e.g., 330 of FIG. 3) is formed in at least a portion of a boundary area (e.g., 313 of FIG. 3) of the first area and the second area to reduce heat spread.

According to an embodiment of the present disclosure, the slit (e.g., 330 of FIG. 3) may form an opening that penetrates at least a surface of the bracket.

According to an embodiment of the present disclosure, the slit (e.g., 330 of FIG. 3) may form a recess that is formed in an inner surface of the bracket and that does not penetrate an outer surface of the bracket.

According to an embodiment of the present disclosure, the slit (e.g., 330 of FIG. 3) may be formed of a material having a first thermal conductivity, and a proximate area where the slit is not formed in the bracket may be formed of a material having a second thermal conductivity.

According to an embodiment of the present disclosure, a substantially overall area of the slit (e.g., 330 of FIG. 3) may be formed in the boundary area (e.g., 313 of FIG. 3).

According to an embodiment of the present disclosure, the slit (e.g., 330 of FIG. 3) may be formed adjacent a circuit device disposed in a proximate area (e.g., S3 to S5 of FIG. 3) of an upper area of the bracket among the one or more circuit devices.

According to an embodiment of the present disclosure, the circuit device may generate higher heat than another circuit device of the one or more circuit devices.

According to an embodiment of the present disclosure, the slit (e.g., 330 of FIG. 3) may include includes a first slit area (e.g., 331 of FIG. 3) having a first shape, a first size, a first depth, a first direction, or a first thermal conductivity and a second slit area (e.g., 332 of FIG. 3) connected with the first slit area and having a second shape, a second size, a second depth, a second direction, or a second thermal conductivity.

According to an embodiment of the present disclosure, a bent area may be formed in the first slit area but not in the second slit area.

According to an embodiment of the present disclosure, the one or more circuit devices may include a first circuit device (e.g., 352a of FIG. 3) for managing power of the battery and a second circuit device (e.g., 352b of FIG. 3) for executing at least one program, and the first slit area may be positioned adjacent the first circuit device, and the second slit area may be positioned adjacent the second circuit device.

According to an embodiment of the present disclosure, the slit (e.g., 530 of FIG. 10) may further include a third slit area (e.g., 533 of FIG. 10) shaped as a step having a different height from the first slit area (e.g., 531 of FIG. 10) or the second slit area (e.g., 532 of FIG. 10).

According to an embodiment of the present disclosure, the slit may form a path along which heat radiated from the one or more circuit devices passes through the third slit area to the first slit area or the second slit area.

According to an embodiment of the present disclosure, at least one heat conducting member (e.g., 440 of FIG. 7) may be disposed in at least a portion of an area where at least one heat-radiating circuit device of the one or more circuit devices is disposed in the second area to form a heat conducting path along which the radiated heat may move in a direction different from a direction in which the radiated heat is directed to the battery.

According to an embodiment of the present disclosure, another heat conducting member may be disposed in at least a portion of the first area.

According to an embodiment of the present disclosure, the at least one heat conducting member may be connected with the other heat conducting member.

According to an embodiment of the present disclosure, the at least one heat conducting member may include a first heat conducting member with a first thermal conductivity and a second heat conducting member formed on the first heat conducting member and having a second thermal conductivity.

According to an embodiment of the present disclosure, at least one recess (e.g., 661 of FIG. 13) may be formed in at least a portion (e.g., 660 of FIG. 13) of an area where at least one heat-radiating circuit device among the one or more circuit devices (e.g., 652 of FIG. 13) is disposed in the second area.

According to an embodiment of the present disclosure, the bracket (e.g., 710 of FIG. 14) may include a hole penetrated to an outside, and wherein the at least one recess forms at least a portion of a heat conducting path (e.g., 780 of FIG. 14) along which the radiated heat may move to the hole. According to an embodiment of the present disclosure, the bracket may include a shielding wall disposed between the first area and the second area, and at least a portion of the slit or another slit may be formed in the shielding wall.

According to an embodiment of the present disclosure, the slit may be formed to at least partially surround the one or more circuit devices.

According to an embodiment of the present disclosure, a portable communication device may comprise a battery, a printed circuit board including at least one circuit device driven using power from the battery, and a bracket including a first area for receiving the battery and a second area for receiving the printed circuit board, wherein the bracket comprises a heat-radiating structure formed between the first area and the second area or in at least one of the first area and the second area to reduce conduction of heat generated from some circuit devices of the at least one circuit device to the battery.

As is apparent from the foregoing description, according to various embodiments of the present disclosure, in an electronic device, a heat-radiating structure is provided between a printed circuit board (PCB) and a bracket where a battery is seated, rerouting the path along which heat radiation from circuit devices on the PCB flow to the battery to allow for better cooling on the battery.

According to various embodiments of the present disclosure, in an electronic device, differences in temperature between an upper and lower area in a battery disposed in a bracket may be reduced, balancing energy charged in the battery cell and stabilizing the battery performance.

According to various embodiments of the present disclosure, heat radiation from a PCB disposed in a bracket may be led to spread, keeping electronic parts in a stable performance and rendering the electronic device more compact.

It is apparent to one of ordinary skill in the art that the camera modules according to various embodiments of the present disclosure as described above are not limited to the above-described embodiments and those shown in the drawings, and various changes, modifications, or alterations may be made thereto without departing from the scope of the present disclosure.

While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:

1. A portable communication device, comprising:
   a battery;
   a printed circuit board comprising one or more circuit devices driven using power from the battery; and
   a bracket comprising a first area for receiving the battery and a second area for receiving the printed circuit board,
   wherein a slit is formed in at least a portion of a boundary area of the first area and the second area to reduce heat spread,
   wherein the slit comprises a first slit area having at least one of a first shape, a first size, a first depth, or a first direction, and a second slit area extending from the first slit area and having at least one of a second shape, a second size, a second depth, or a second direction different from the first slit area, and
   wherein a bending portion of the first slit area is curved toward the one or more circuit devices to prevent formation of a heat path from the one or more circuit devices to the battery of the first area.

2. The portable communication device of claim 1, wherein the slit forms an opening that penetrates at least a surface of the bracket.

3. The portable communication device of claim 1,
   wherein the slit is formed of a material having a first thermal conductivity, and
   wherein a proximate area where the slit is not formed in the bracket is formed of a material having a second thermal conductivity.

4. The portable communication device of claim 1, wherein a substantial overall area of the slit is formed in the boundary area.

5. The portable communication device of claim 1,
   wherein the slit is formed adjacent a circuit device disposed in a proximate area of an upper area of the bracket among the one or more circuit devices, and
   wherein the circuit device generates more heat than another circuit device of the one or more circuit devices.

6. The portable communication device of claim 1, wherein a bent area is formed in the first slit area but not in the second slit area.

7. The portable communication device of claim 6,
   wherein the one or more circuit devices comprise a first circuit device for managing power of the battery and a second circuit device for executing at least one program, and
   wherein the first slit area is positioned adjacent the first circuit device, and the second slit area is positioned adjacent the second circuit device.

8. The portable communication device of claim 1, wherein the slit further comprises a third slit area shaped as a step having a different height from the first slit area or the second slit area.

9. The portable communication device of claim 8, wherein the slit forms a path along which heat radiated from the one or more circuit devices passes through the third slit area to the first slit area or the second slit area.

10. The portable communication device of claim 1, wherein at least one heat conducting member is disposed in at least a portion of an area where at least one heat-radiating circuit device of the one or more circuit devices is disposed in the second area to form a heat conducting path along which radiated heat is moveable in a direction different from a direction in which the radiated heat is directed to the battery.

11. The portable communication device of claim 10, wherein another heat conducting member is disposed in at least a portion of the first area.

12. The portable communication device of claim 11, wherein the at least one heat conducting member is connected with the other heat conducting member.

13. The portable communication device of claim 10, wherein the at least one heat conducting member comprises a first heat conducting member with a first thermal conductivity and a second heat conducting member formed on the first heat conducting member and having a second thermal conductivity.

14. The portable communication device of claim 1, wherein at least one recess is formed in at least a portion of an area where at least one heat-radiating circuit device among the one or more circuit devices is disposed in the second area.

15. The portable communication device of claim 14,
wherein the bracket comprises a hole penetrated to an outside, and
wherein the at least one recess forms at least a portion of a heat conducting path along which radiated heat is moveable to the hole.

16. The portable communication device of claim 1,
wherein the bracket comprises a shielding wall disposed between the first area and the second area, and
wherein at least a portion of the slit or another slit is formed in the shielding wall.

17. The portable communication device of claim 1, wherein the slit surrounds at least some of the one or more circuit devices.

18. A portable communication device, comprising:
a battery;
a printed circuit board comprising at least one circuit device driven using power from the battery; and
a bracket comprising a first area for receiving the battery and a second area for receiving the printed circuit board,
wherein the bracket comprises a heat-radiating structure formed between the first area and the second area or in at least one of the first area and the second area to reduce conduction of heat generated from some circuit devices of the at least one circuit device to the battery,
wherein the heat-radiating structure comprises a first slit area having at least one of a first shape, a first size, a first depth, a first direction, or a first thermal conductivity, and a second slit area extending from the first slit area and having at least one of a second shape, a second size, a second depth, a second direction, or a second thermal conductivity different from the first slit area, and
wherein a bending portion of the first slit area is curved toward the at least one circuit device to prevent formation of a heat path from the at least one circuit device to the battery of the first area.

* * * * *